(12) United States Patent
Ikeuchi et al.

(10) Patent No.: US 11,495,728 B2
(45) Date of Patent: Nov. 8, 2022

(54) PIEZOELECTRIC DEVICE AND METHOD OF MANUFACTURING PIEZOELECTRIC DEVICE

(71) Applicant: Murata Manufacturing Co., Ltd., Nagaokakyo (JP)

(72) Inventors: Shinsuke Ikeuchi, Nagaokakyo (JP); Tetsuya Kimura, Nagaokakyo (JP); Katsumi Fujimoto, Nagaokakyo (JP); Yutaka Kishimoto, Nagaokakyo (JP); Fumiya Kurokawa, Nagaokakyo (JP); Yuzo Kishi, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 461 days.

(21) Appl. No.: 16/777,925

(22) Filed: Jan. 31, 2020

(65) Prior Publication Data

US 2020/0168785 A1  May 28, 2020

Related U.S. Application Data

(63) Continuation of application No. PCT/JP2018/042572, filed on Nov. 16, 2018.

(30) Foreign Application Priority Data

Nov. 22, 2017 (JP) .............................. JP2017-224543

(51) Int. Cl.
*H01L 41/047* (2006.01)
*H01L 41/053* (2006.01)
(Continued)

(52) U.S. Cl.
CPC ........ *H01L 41/0477* (2013.01); *H01L 41/053* (2013.01); *H01L 41/083* (2013.01);
(Continued)

(58) Field of Classification Search
CPC .............. H01L 41/0477; H01L 41/053; H01L 41/0805; H01L 41/083; H01L 41/09;
(Continued)

(56) References Cited

U.S. PATENT DOCUMENTS

2007/0227333 A1  10/2007  Higuchi et al.
2010/0088868 A1  4/2010  Kando et al.
(Continued)

FOREIGN PATENT DOCUMENTS

JP      4404218 B2    1/2010
JP      6132022 B2    5/2017
(Continued)

OTHER PUBLICATIONS

IP.com search (Year: 2022).*
Official Communication issued in International Patent Application No. PCT/JP2018/042572, dated Jan. 22, 2019.

*Primary Examiner* — Lisa Solomon
(74) *Attorney, Agent, or Firm* — Keating & Bennett, LLP

(57) ABSTRACT

A piezoelectric device includes a piezoelectric body at least a portion of which can bend and vibrate, an upper electrode on an upper surface of the piezoelectric body and in which distortion of a crystal lattice is reduced as a distance from the upper surface of the piezoelectric body increases, a lower electrode on a lower surface of the piezoelectric body and in which distortion of a crystal lattice is reduced as a distance from the upper surface of the piezoelectric body increases, and a support substrate below the piezoelectric body, in which a recess extending from a lower surface of the support substrate toward the lower surface of the piezoelectric device is provided.

11 Claims, 31 Drawing Sheets

(51) Int. Cl.
  *H01L 41/08* (2006.01)
  *H01L 41/083* (2006.01)
  *H01L 41/09* (2006.01)
  *H01L 41/297* (2013.01)

(52) U.S. Cl.
  CPC .......... *H01L 41/0805* (2013.01); *H01L 41/09* (2013.01); *H01L 41/297* (2013.01)

(58) Field of Classification Search
  CPC ............... H01L 41/297; H01L 41/0815; H01L 41/0973; H01L 41/313; H01L 41/0933; H03H 9/02015; H03H 3/0072; H03H 9/02433; H03H 9/2405; H03H 2009/0248; H03H 2009/02488; H03H 2009/2442
  See application file for complete search history.

(56) References Cited

U.S. PATENT DOCUMENTS

| | | |
|---|---|---|
| 2016/0156332 A1 | 6/2016 | Umeda |
| 2016/0240768 A1 | 8/2016 | Fujii et al. |
| 2017/0197414 A1* | 7/2017 | Naganuma ............ H01L 41/083 |
| 2018/0351075 A1 | 12/2018 | Sawaki et al. |

FOREIGN PATENT DOCUMENTS

| | | |
|---|---|---|
| WO | 2009/081651 A1 | 7/2009 |
| WO | 2015025716 A1 | 2/2015 |
| WO | 2015/064423 A1 | 5/2015 |
| WO | 2017/135166 A1 | 8/2017 |

* cited by examiner

PIEZOELECTRIC DEVICE AND METHOD OF MANUFACTURING PIEZOELECTRIC DEVICE

CROSS REFERENCE TO RELATED APPLICATIONS

This application claims the benefit of priority to Japanese Patent Application No. 2017-224543 filed on Nov. 22, 2017 and is a Continuation Application of PCT Application No. PCT/JP2018/042572 filed on Nov. 16, 2018. The entire contents of each application are hereby incorporated herein by reference.

BACKGROUND OF THE INVENTION

1. Field of the Invention

The present invention relates to a piezoelectric device and a method of manufacturing a piezoelectric device.

2. Description of the Related Art

A vibrator having a unimorph structure or a bimorph structure, which is used for a clock oscillator, a piezoelectric buzzer, or the like, has been developed. The unimorph structure has a laminated structure including a piezoelectric body and a passive elastic layer or a piezoelectric body to which a voltage is not applied. An upper electrode is disposed on an upper portion of the piezoelectric body, and a lower electrode is disposed on a lower portion of the piezoelectric body. When a voltage is applied to the piezoelectric body by using the upper electrode and the lower electrode, the piezoelectric body tends to expand and contract in an in-plane direction. However, since the passive elastic layer or the piezoelectric body to which a voltage is not applied does not expand and contract, the unimorph structure bends and vibrates. The bimorph structure is a laminated structure of two layers of piezoelectric bodies. An elastic plate such as a metal plate called a shim may be interposed between the two layers of piezoelectric bodies. When a voltage is applied to the two layers of piezoelectric bodies, one piezoelectric body extends in the in-plane direction and another piezoelectric body tends to contract in the in-plane direction, so that the two layers of piezoelectric bodies bend as a whole. The piezoelectric body is made of, for example, aluminum nitride (AlN), lead zirconate titanate (PZT), or the like (see, for example, Japanese Patent No. 4404218 and Japanese Patent No. 6132022). The piezoelectric body is formed on the lower electrode by, for example, a vapor deposition method, a sputtering method, a laser ablation method, a chemical vapor deposition (CVD) method, or the like. Then, the upper electrode is formed on the piezoelectric body.

SUMMARY OF THE INVENTION

Preferred embodiments of the present invention provide piezoelectric devices each having high reliability, and methods of manufacturing a piezoelectric device.

According to a preferred embodiment of the present invention, a piezoelectric device includes a piezoelectric body at least a portion of which is capable of bending and vibrating, an upper electrode which is disposed on an upper surface of the piezoelectric body and in which distortion of a crystal lattice is reduced as a distance from the upper surface of the piezoelectric body increases, a lower electrode which is disposed on a lower surface of the piezoelectric body and in which distortion of a crystal lattice is reduced as a distance from the lower surface of the piezoelectric body increases, and a support substrate disposed below the piezoelectric body, in which a recess extending from a lower surface of the support substrate toward the lower surface of the piezoelectric body is provided.

According to a preferred embodiment of the present invention, a method of manufacturing a piezoelectric device in which at least a portion of a piezoelectric body is capable of bending and vibrating, includes depositing a conductive material on a lower surface of the piezoelectric body to form a lower electrode made of the deposited conductive material, depositing a conductive material on an upper surface of the piezoelectric body to form an upper electrode made of the deposited conductive material, disposing a support substrate below the piezoelectric body, and providing a recess extending from a lower surface of the support substrate toward the lower surface of the piezoelectric body.

According to preferred embodiments of the present invention, piezoelectric devices each having high reliability and methods of manufacturing a piezoelectric device are provided.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
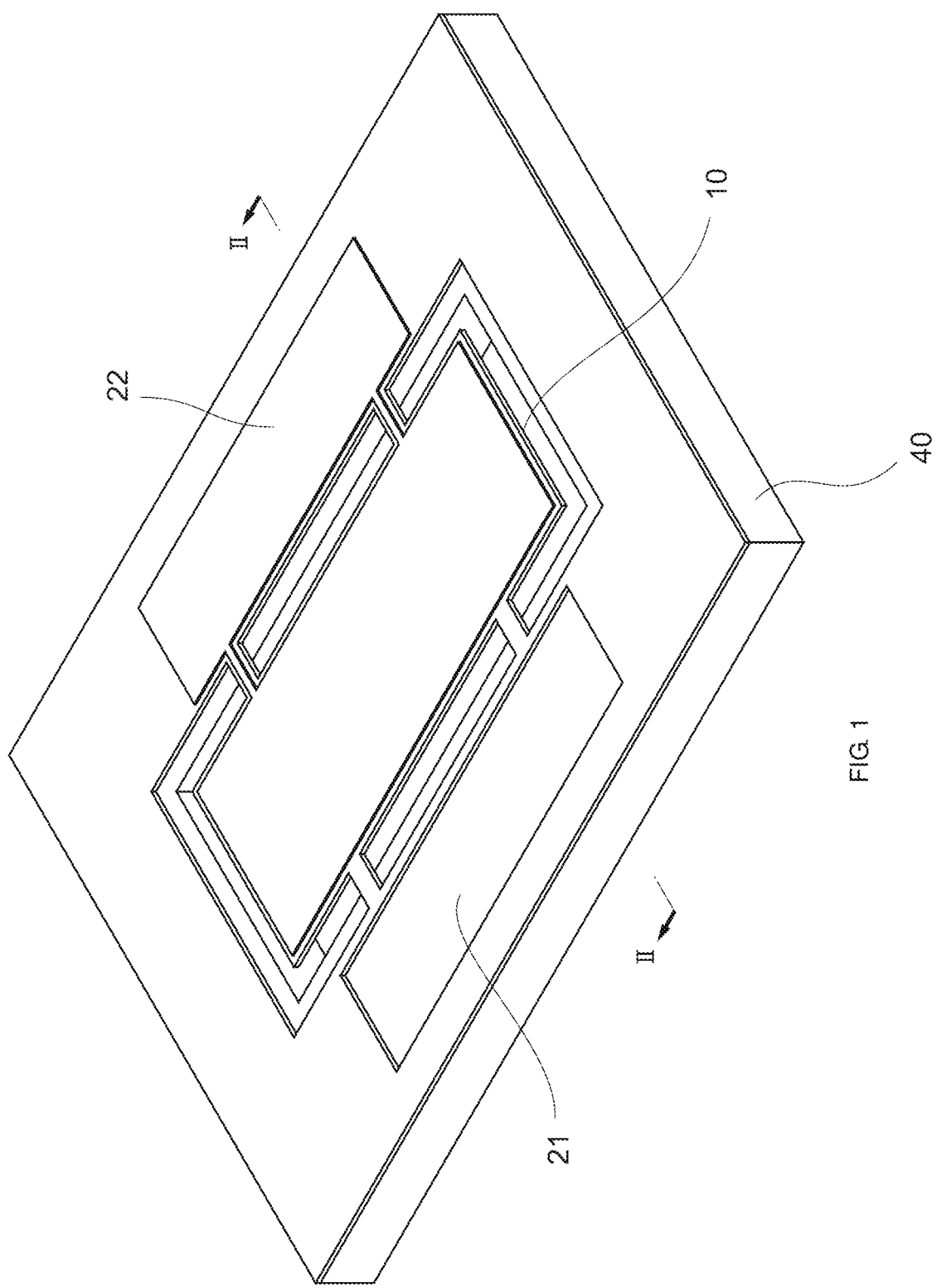
FIG. 1 is an upper perspective view illustrating a piezoelectric device according to a first preferred embodiment of the present invention.

Hereinafter, preferred embodiments of the present invention will be described in detail with reference to the accompanying drawings. In the following description of the drawings, the same or similar portions are denoted by the same or similar reference numerals. However, the drawings are schematic. Therefore, specific dimensions and the like should be determined by comparing the following description. In addition, each of the drawings includes portions in which mutual dimension relationships and ratios are different.

First Preferred Embodiment

Figure 2:
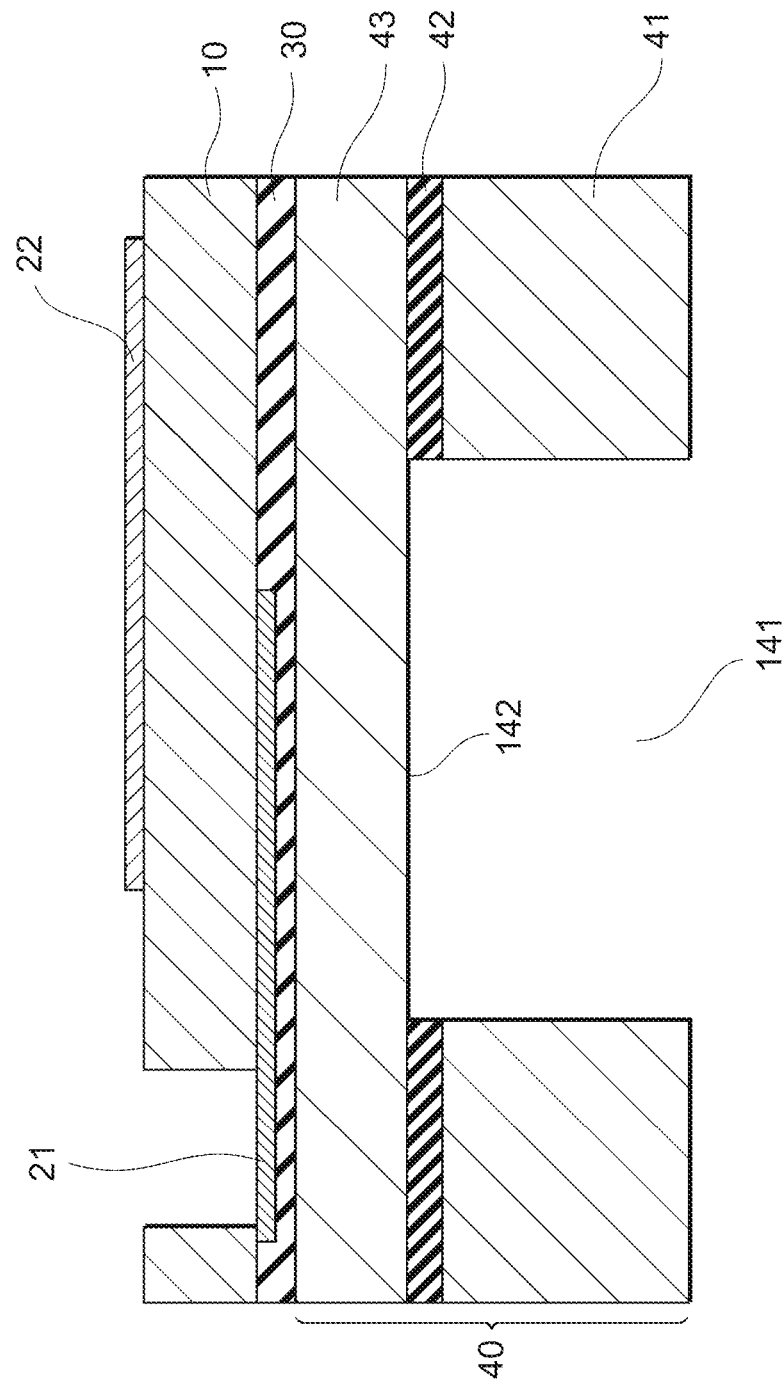
FIG. 2 is a schematic perspective view illustrating the piezoelectric device according to the first preferred embodiment of the present invention, as viewed from a direction of a line II-II in FIG. 1.
Figure 3:
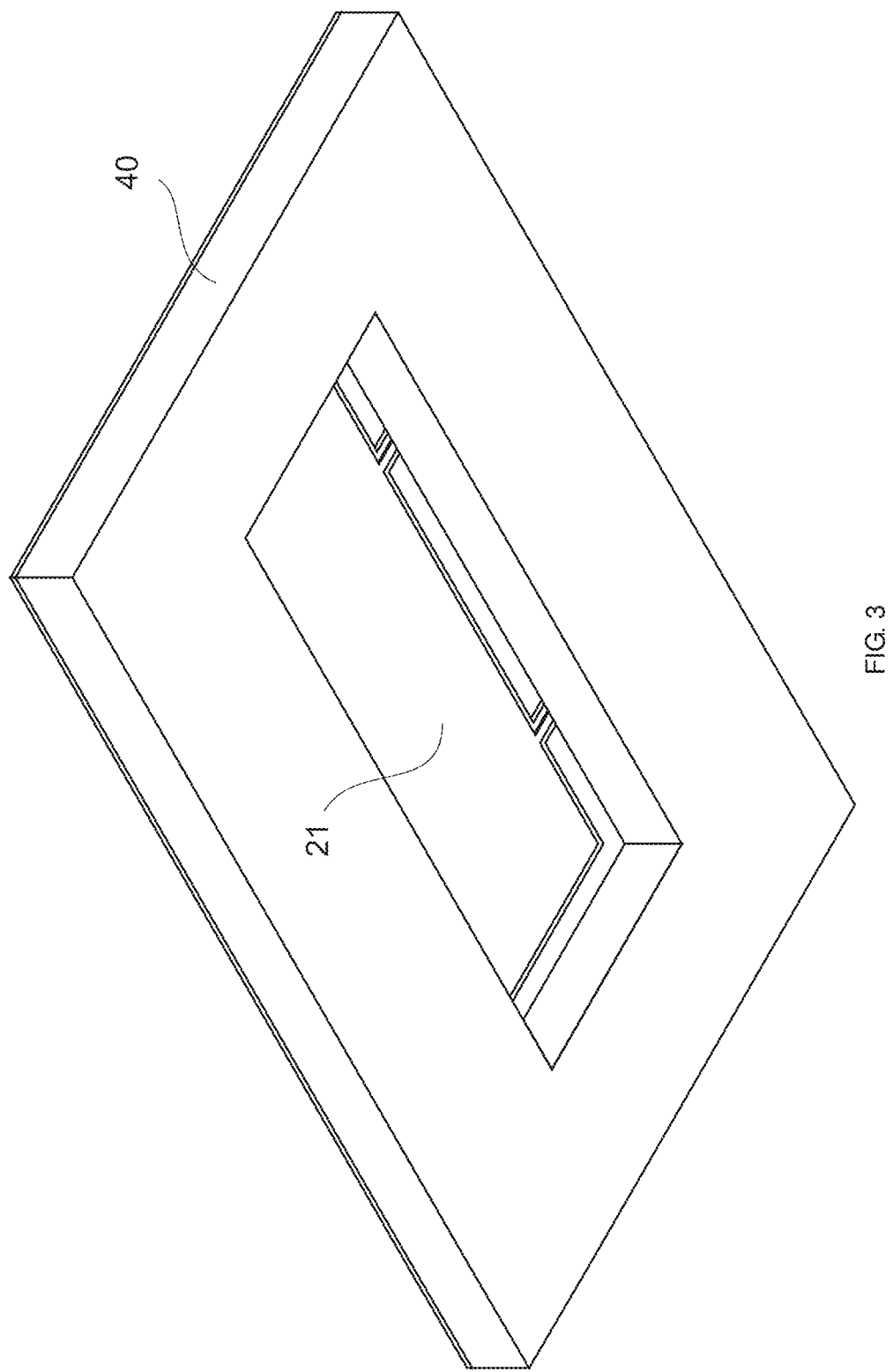
FIG. 3 is a lower perspective view illustrating the piezoelectric device according to the first preferred embodiment of the present invention.

A piezoelectric device according to a first preferred embodiment of the present invention includes, as illustrated in FIG. 1, which is an upper perspective view, FIG. 2, which is a schematic cross-sectional view as viewed from a direction of a line II-II in FIG. 1, and FIG. 3, which is a lower perspective view, a piezoelectric body 10 at least a portion of which can bend and vibrate, an upper electrode 22 which is disposed on an upper surface of the piezoelectric body 10 and in which distortion of a crystal lattice is reduced as a distance from the upper surface of the piezoelectric body 10 increases, a lower electrode 21 which is disposed on a lower surface of the piezoelectric body 10 and in which distortion of a crystal lattice is reduced as a distance from the lower surface of the piezoelectric body 10 increases, and a support substrate 40 disposed below the piezoelectric body 10. The piezoelectric device includes a recess 141 extending from the lower surface of the support substrate 40 toward the lower surface of the piezoelectric body 10.

The piezoelectric device according to the first preferred embodiment may further include an amorphous layer 30 disposed on the lower surface of the piezoelectric body 10 and on the lower surface of the lower electrode 21. The support substrate 40 may be disposed on a lower surface of the amorphous layer 30.

The piezoelectric body 10 is preferably made of, for example, a single crystal such as lithium tantalate (LT) lithium niobate (LN) or the like. The piezoelectric body 10 has a uniform film quality over a portion in which the lower electrode 21 is provided downward and a portion in which the lower electrode 21 is not provided downward, and has the same polarization (orientation) state within the film. The upper surface and the lower surface of the piezoelectric body 10 are flat and smooth except for portions which are processed for extraction electrodes, device formation, and the like, and does not include any steps and tapered structures. However, Total Thickness Variation (TTV) equal to or less than about 2 μm, for example, is acceptable.

The lower electrode 21 and the upper electrode 22 are preferably made of, for example, a conductive material such as platinum (Pt), gold (Au) or the like. The lower electrode 21 and the upper electrode 22 are capable of applying a voltage to the piezoelectric body 10. The lower electrode 21 and the upper electrode 22 have at least one kind of triaxial texture. Due to misfit dislocation, the lower electrode 21 on the side close to the piezoelectric body 10 is distorted in the crystal lattice, and the lower electrode 21 is structured such that distortion of the crystal lattice is reduced as a distance from the piezoelectric body 10 increases. Further, due to the misfit dislocations, the upper electrode 22 on the side close to the piezoelectric body 10 is distorted in the crystal lattice, and the lower electrode 22 is such that distortion of the crystal lattice is reduced as a distance from the piezoelectric body 10 increases. Therefore, crystallinity of the lower electrode 21 and the upper electrode 22 varies symmetrically with the piezoelectric body 10 interposed therebetween.

In the piezoelectric device according to the first preferred embodiment, a lower adhesion layer which enables the piezoelectric body 10 and the lower electrode 21 to be in close contact with each other may be provided between the piezoelectric body 10 and the lower electrode 21. The lower adhesion layer is preferably made of, for example, a metal such as titanium (Ti), chromium (Cr) or the like. At least a portion of the lower adhesion layer may be oxidized. In the piezoelectric device according to the first preferred embodiment, an upper adhesion layer which enables the piezoelectric body 10 and the upper electrode 22 to be close contact with each other may be provided between the piezoelectric body 10 and the upper electrode 22. The upper adhesion layer is preferably made of, for example, a metal such as titanium (Ti), chromium (Cr) or the like. At least a portion of the upper adhesion layer may be oxidized.

The amorphous layer 30 is preferably made of, for example, an insulating material such as silicon oxide. The amorphous layer 30 may be a heat insulating material. The lower electrode 21 is embedded in the amorphous layer 30.

The support substrate 40 is preferably, for example, a silicon on insulator (SOI) substrate including a handle layer 41, an embedded oxide film 42 disposed on the handle layer 41, and an active layer 43 disposed on the embedded oxide film 42. The lower surface of the amorphous layer 30 and an upper surface of the active layer 43 of the SOI substrate are bonded to each other.

The embedded oxide film 42 may be exposed from a bottom surface 142 of the recess 141, the active layer 43 may be exposed, the amorphous layer 30 may be exposed, or the piezoelectric body 10 and the lower electrode 21 may be exposed.

In the first preferred embodiment, when viewed from above, a portion in which at least the upper electrode 22, the piezoelectric body 10, and the lower electrode 21 overlap each other defines and functions as a flexural vibration membrane. When a voltage is applied to the piezoelectric body 10 from the lower electrode 21 and the upper electrode 22, the piezoelectric body 10 tends to expand and contract in the in-plane direction, but at least the upper electrode 22 and the lower electrode 21 do not expand and contract, so that the flexural vibration membrane bends and vibrates vertically.

Depending on a position of the bottom surface of the recess 141 provided in the piezoelectric device, the flexural vibration membrane may further include at least a portion of the amorphous layer 30. In addition, the flexural vibration membrane may further include at least a portion of the amorphous layer 30 and at least a portion of the active layer 43. Alternatively, the flexural vibration membrane may further include at least a portion of the amorphous layer 30, at least a portion of the active layer 43, and at least a portion of the oxide film 42. It is preferable that a neutral plane within the flexural vibration membrane be located outside the piezoelectric body 10 when the flexural vibration membrane bends and vibrates.

In a case where the amorphous layer 30 is exposed from the bottom surface of the recess 141, it is preferable that a thickness of the amorphous layer 30 is set such that the neutral plane is within the amorphous layer 30 and not within the piezoelectric body 10 when the flexural vibration membrane bends and vibrates.

In a case where the active layer 43 is exposed from the bottom surface of the recess 141, it is preferable that a total thickness of the amorphous layer 30 and the active layer 43 be set in a manner such that the neutral plane is within the amorphous layer 30 or the active layer 43 and not within the piezoelectric body 10 when the flexural vibration membrane bends and vibrates.

In a case where the embedded oxide film 42 is exposed from the bottom surface of the recess 141, it is preferable that a total thickness of the amorphous layer 30, the active layer 43, and the embedded oxide film 42 is set such that the neutral plane is within the amorphous layer 30, the active layer 43, or the embedded oxide film 42, and not within the piezoelectric body 10, when the flexural vibration membrane bends and vibrates.

Next, a non-limiting example of a method of manufacturing the piezoelectric device according to the first preferred embodiment will be described.

Figure 4:
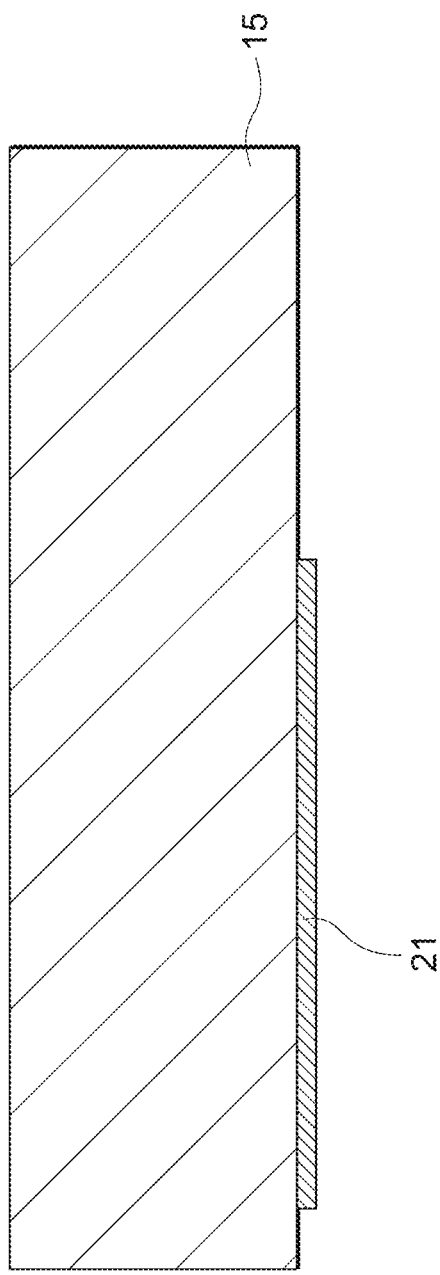
FIG. 4 is a schematic cross-sectional view illustrating a method of manufacturing the piezoelectric device according to the first preferred embodiment of the present invention.

As illustrated in FIG. 4, a substrate piezoelectric body preferably made of, for example, a single crystal such as lithium tantalate (LT), lithium niobate (LN) and the like is prepared, and a conductive film preferably made of, for example, a conductive material such as platinum (Pt), gold (Au) and the like is formed on a smooth and flat lower surface of the piezoelectric body 15 by heteroepitaxial growth. The lower electrode 21 is formed on a lower surface of the piezoelectric body 15 by patterning the conductive film into a predetermined shape. A lower adhesion layer preferably made of, for example, a metal such as titanium (Ti), chromium (Cr) and the like may be formed on the lower surface of the piezoelectric body 15, and then a conductive film may be formed on the lower adhesion layer.

Figure 5:
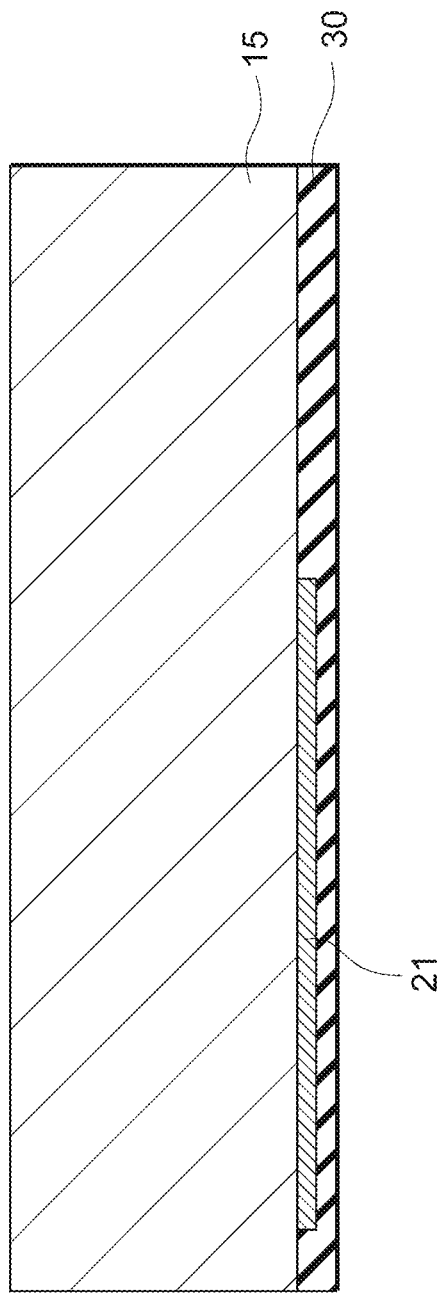
FIG. 5 is a schematic cross-sectional view illustrating the method of manufacturing the piezoelectric device according to the first preferred embodiment of the present invention.

As illustrated in FIG. 5, the amorphous layer 30 preferably made of, for example, silicon dioxide ($SiO_2$) or the like is formed on the lower surface of the piezoelectric body 15 and on the lower surface of the lower electrode 21. Accordingly, the lower electrode 21 is disposed in the amorphous layer 30. Thereafter, the lower surface of the amorphous layer 30 is subjected to chemical mechanical polishing (CMP) to smooth the lower surface of the amorphous layer 30.

Figure 6:
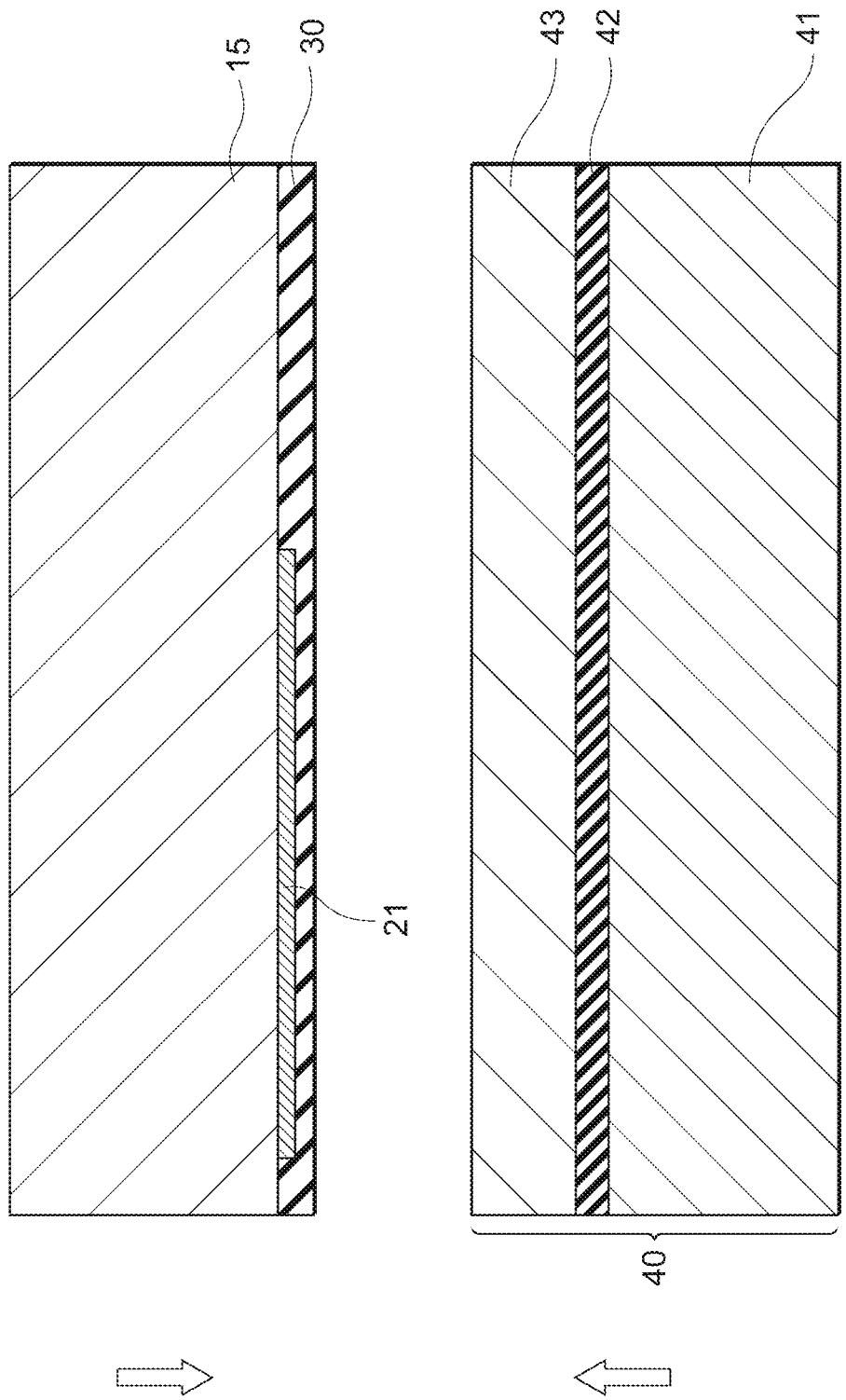
FIG. 6 is a schematic cross-sectional view illustrating the method of manufacturing the piezoelectric device according to the first preferred embodiment of the present invention.
Figure 7:
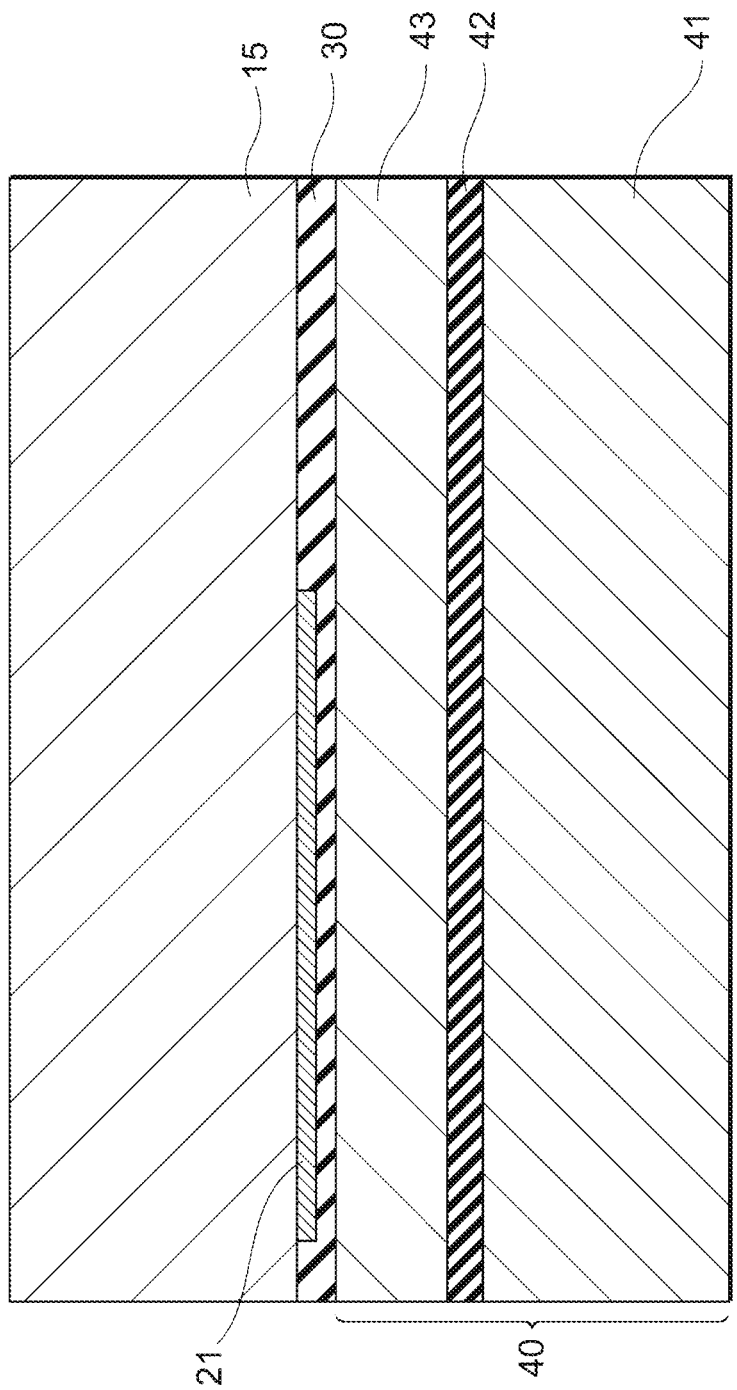
FIG. 7 is a schematic cross-sectional view illustrating the method of manufacturing the piezoelectric device according to the first preferred embodiment of the present invention.
Figure 8:
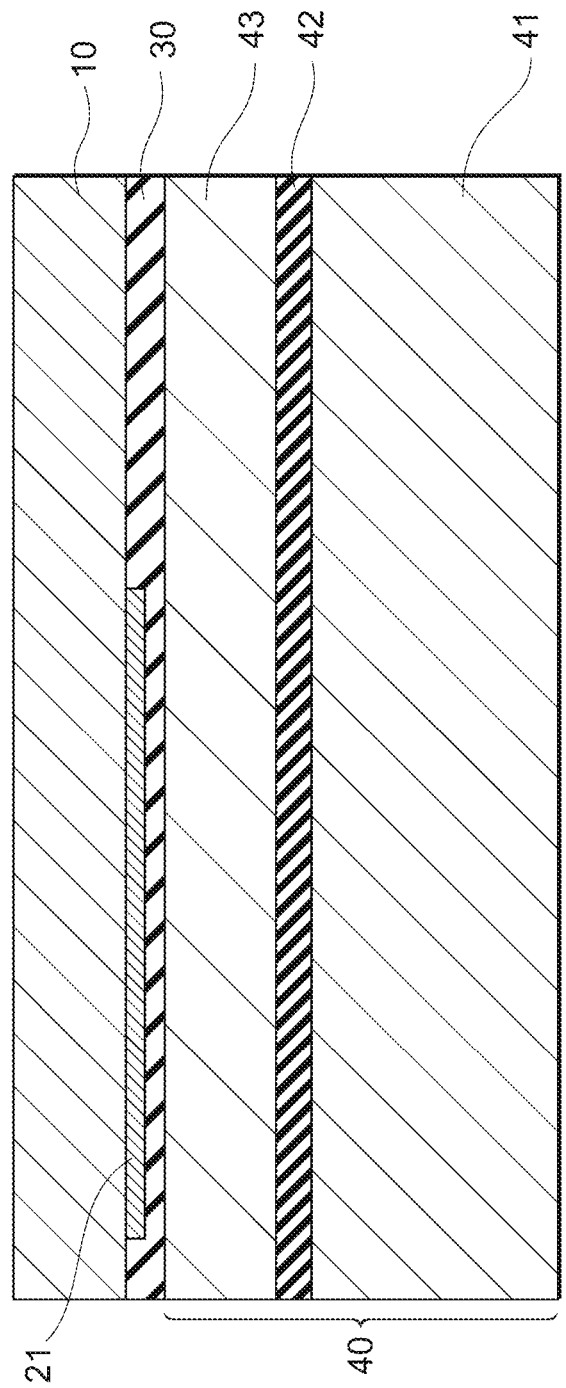
FIG. 8 is a schematic cross-sectional view illustrating the method of manufacturing the piezoelectric device according to the first preferred embodiment of the present invention.

As illustrated in FIG. 6, the SOI substrate including the handle layer 41, the embedded oxide film 42 disposed on the handle layer 41, and the active layer 43 disposed on the embedded oxide film 42 is prepared as the support substrate 40. Next, as illustrated in FIG. 7, the upper surface of the active layer 43 of the SOI substrate and the lower surface of the amorphous layer 30 are directly bonded to each other. Thereafter, as illustrated in FIG. 8, the substrate piezoelectric body 15 is polished from the upper surface side to be thinned, thus forming the piezoelectric body 10 as a film. A thickness of the piezoelectric body 10 is set such that a desired expansion and contraction occurs when a voltage is applied thereto.

Figure 9:
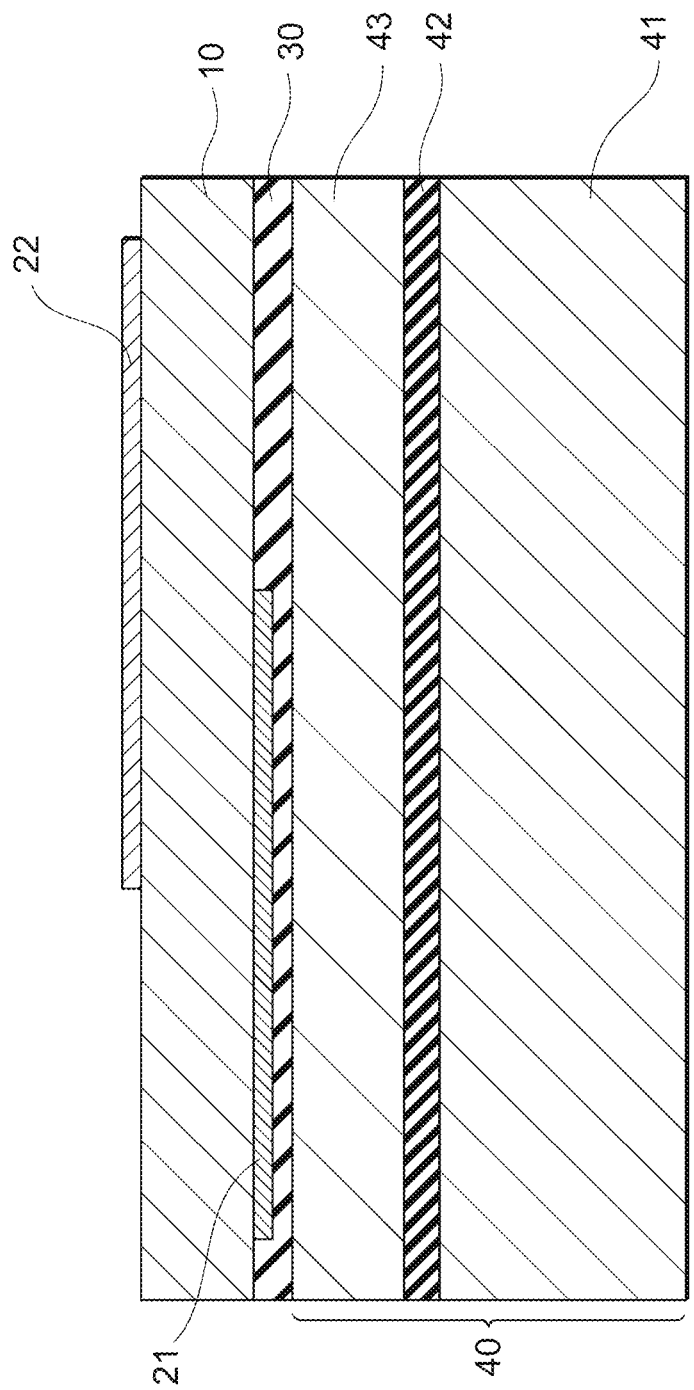
FIG. 9 is a schematic cross-sectional view illustrating the method of manufacturing the piezoelectric device according to the first preferred embodiment of the present invention.

As illustrated in FIG. 9, a conductive film preferably made of, for example, a conductive material such as platinum (Pt), gold (Au) and the like is formed on the upper surface of the piezoelectric body 10 by the heteroepitaxial growth. The conductive film is patterned in a predetermined shape to form the upper electrode 22 on a smooth and flat upper surface of the piezoelectric body 10. Alternatively, the upper adhesion layer preferably made of, for example, a metal such as titanium (Ti), chromium (Cr) and the like may be formed on the upper surface of the piezoelectric body 10, and then the conductive film may be formed on the upper adhesion layer. Next, optionally, portions of the active layer 43 of the SOI substrate, the amorphous layer 30, and the piezoelectric body 10 may be removed by an etching method or the like, to be patterned into a desired shape. For example, a wiring connected to the lower electrode 21 exposed by removing a portion of the piezoelectric body 10 may be provided.

The recess 141 illustrated in FIG. 2 is formed in a portion of the lower surface of the handle layer 41 of the SOI substrate toward the lower surface of the piezoelectric body 10, by deep reactive ion etching (Deep RIE) or the like. The SOI substrate may be etched until the lower surface of the embedded oxide film 42 is exposed from the bottom surface 142 of the recess 141, the SOI substrate may be etched until the lower surface of the active layer 43 is exposed, or the SOI substrate may be etched until the amorphous layer 30 is exposed. Alternatively, the SOI substrate and the amorphous layer 30 may be etched until the piezoelectric body 10 and the lower electrode 21 are exposed. It is preferable to set a depth of the recess 141 such that the neutral plane within the flexural vibration membrane is present outside the piezoelectric body 10 when the flexural vibration membrane bends and vibrates. For example, the piezoelectric device according to the first preferred embodiment can be obtained by the manufacturing method including the above steps.

Figure 10:
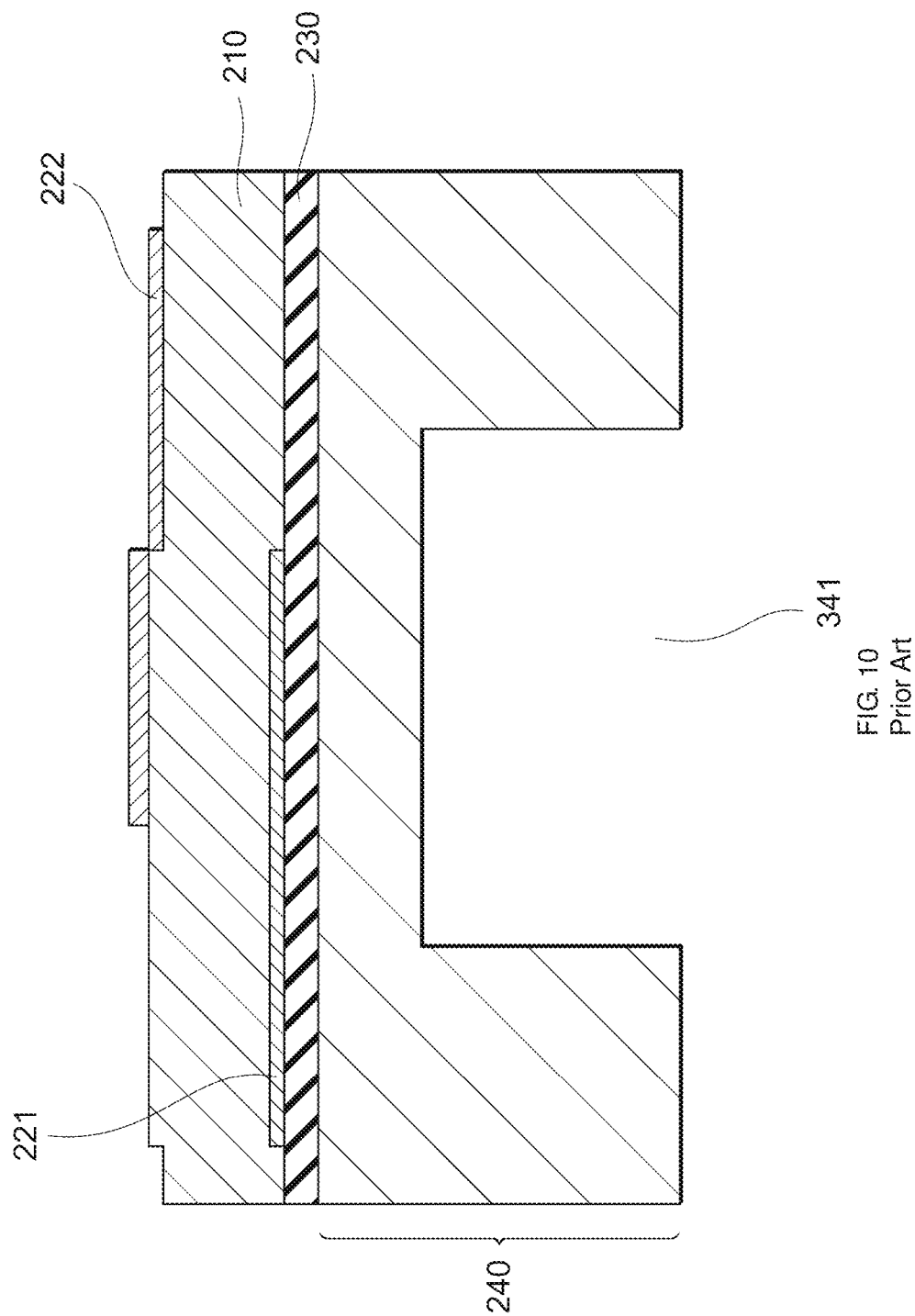
FIG. 10 is a schematic cross-sectional view illustrating a piezoelectric device according to the prior art.

With the existing technique, when manufacturing a piezoelectric device having a flexural vibration membrane, as illustrated in FIG. 10, an amorphous film 230 is formed on a support substrate 240, a lower electrode 221 is formed on the amorphous film 230 by epitaxial growth, and then a piezoelectric body 210 made of aluminum nitride (AlN), lead zirconate titanate (PZT), or the like is formed by, for example, a vapor deposition method, a sputtering method, a laser ablation method, a chemical vapor deposition (CVD) method, or the like, an upper electrode 222 is formed on the piezoelectric body 210, and thereafter, a recess 341 is formed in the support substrate 240. Therefore, in the lower electrode 221, distortion of a crystal lattice is reduced at a portion closer to the piezoelectric body 210 so that a local stress is small, and in the upper electrode 222, distortion of a crystal lattice is reduced at a portion farther away from the piezoelectric body 210 so that a local stress is small.

As such, in the piezoelectric device illustrated in FIG. 10, the distortion of the crystal lattice of the lower electrode 221 and the upper electrode 222 varies asymmetrically with respect to the piezoelectric body 210. Accordingly, in the piezoelectric device illustrated in FIG. 10, in a portion which can bend and vibrate, a stress distribution is asymmetric, warpage tends to be generated, vibration efficiency is poor, and cracks and interfacial peeling tend to occur. In the piezoelectric device illustrated in FIG. 10, when an adhesion layer is formed on the upper surface of the lower electrode 221, crystallinity of the piezoelectric body 210 to be formed thereafter is deteriorated.

In contrast, in the piezoelectric device according to the first preferred embodiment illustrated in FIG. 1 to FIG. 3, as described above, the distortion in the crystal lattice of the lower electrode 21 and the upper electrode 22 varies symmetrically with the piezoelectric body 10 interposed therebetween. Accordingly, in the piezoelectric device according to the first preferred embodiment, in a portion which can bend and vibrate, a stress distribution is symmetrical, warpage is hardly generated, vibration efficiency is good, and cracks and interfacial peeling are hardly generated. Further, in the piezoelectric device according to the first preferred embodiment, even though there is the lower adhesion layer between the lower electrode 21 and the piezoelectric body 10, the crystallinity of the piezoelectric body 10 is not affected. Therefore, according to the first preferred embodiment, it is possible to provide a piezoelectric device having high reliability and a method of manufacturing a piezoelectric device.

Second Preferred Embodiment

Figure 11:
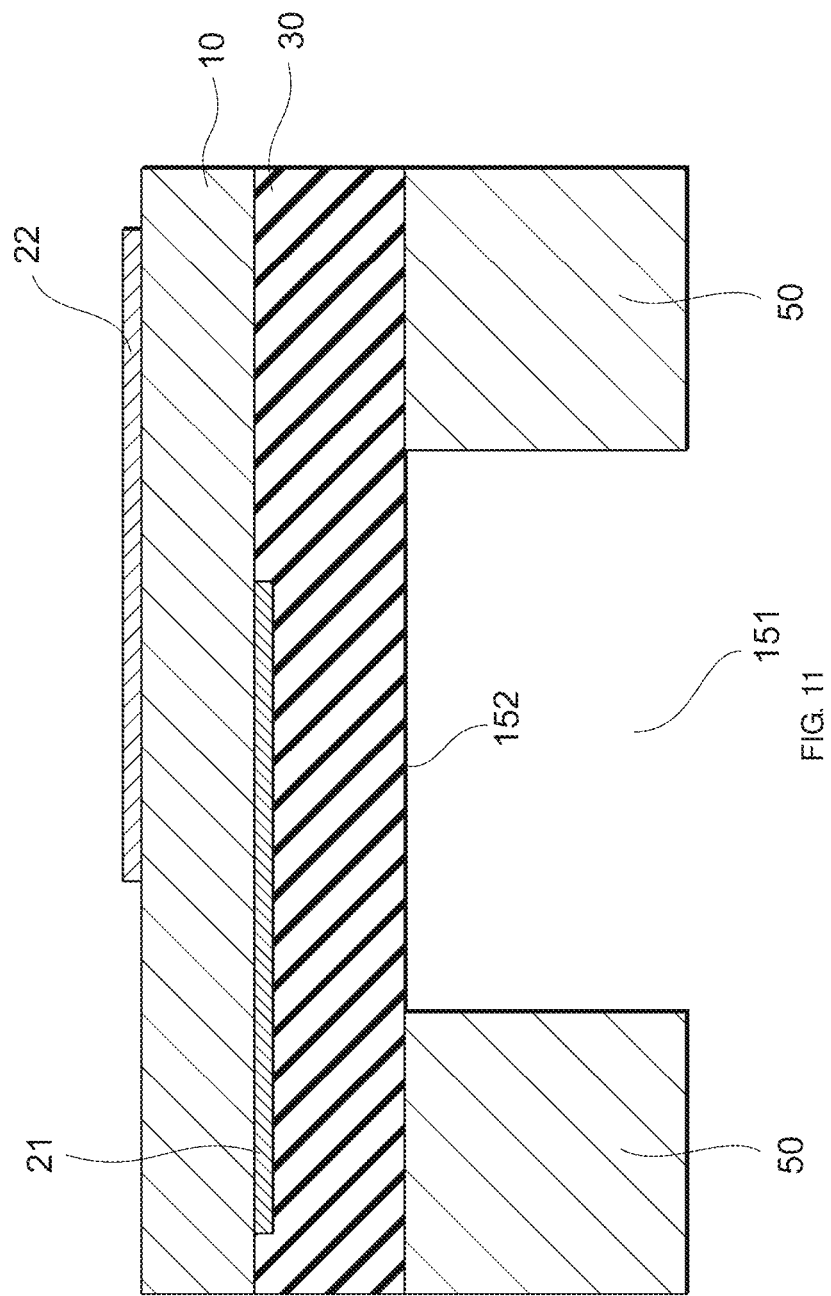
FIG. 11 is a schematic cross-sectional view illustrating a piezoelectric device according to a second preferred embodiment of the present invention.

In a second preferred embodiment of the present invention and the following preferred embodiments, descriptions of the same matters as those in the first preferred embodiment will be omitted, and only different points will be described. In particular, similar advantageous operational effects with the same or similar configuration will not be described for each preferred embodiment. As illustrated in FIG. 11, in a piezoelectric device according to the second preferred embodiment, a support substrate is preferably a silicon substrate, for example. The piezoelectric device according to the second preferred embodiment includes a recess 151 extending from a lower surface of the support substrate 50 toward the lower surface of the piezoelectric body 10. The amorphous layer 30 is exposed from a bottom surface 152 of the recess 151.

Even in the second preferred embodiment, when a voltage is applied to the piezoelectric body 10 from the lower electrode 21 and the upper electrode 22, the piezoelectric body 10 tends to expand and contract in the in-plane direction, but the upper electrode 22, the lower electrode 21, and the amorphous layer 30 do not expand and contract, so that the flexural vibration membrane bends and vibrates vertically. It is preferable that the thickness of the amorphous layer 30 is set such that the neutral plane is within the amorphous layer 30 and not within the piezoelectric body 10 when the flexural vibration membrane bends and vibrates.

Next, a non-limiting example of a method of manufacturing the piezoelectric device according to the second preferred embodiment will be described.

Figure 12:
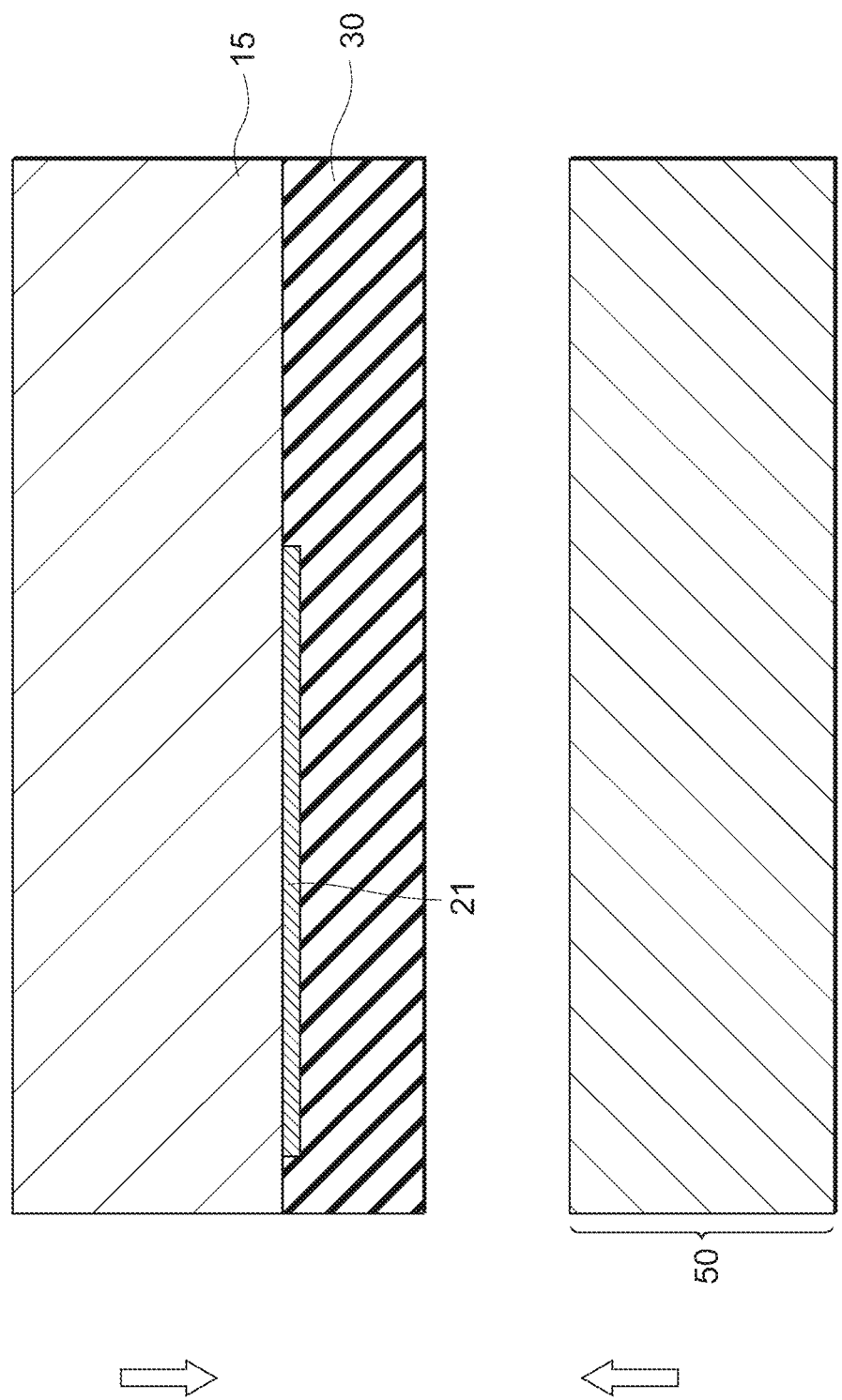
FIG. 12 is a schematic cross-sectional view illustrating a method of manufacturing the piezoelectric device according to the second preferred embodiment of the present invention.
Figure 13:
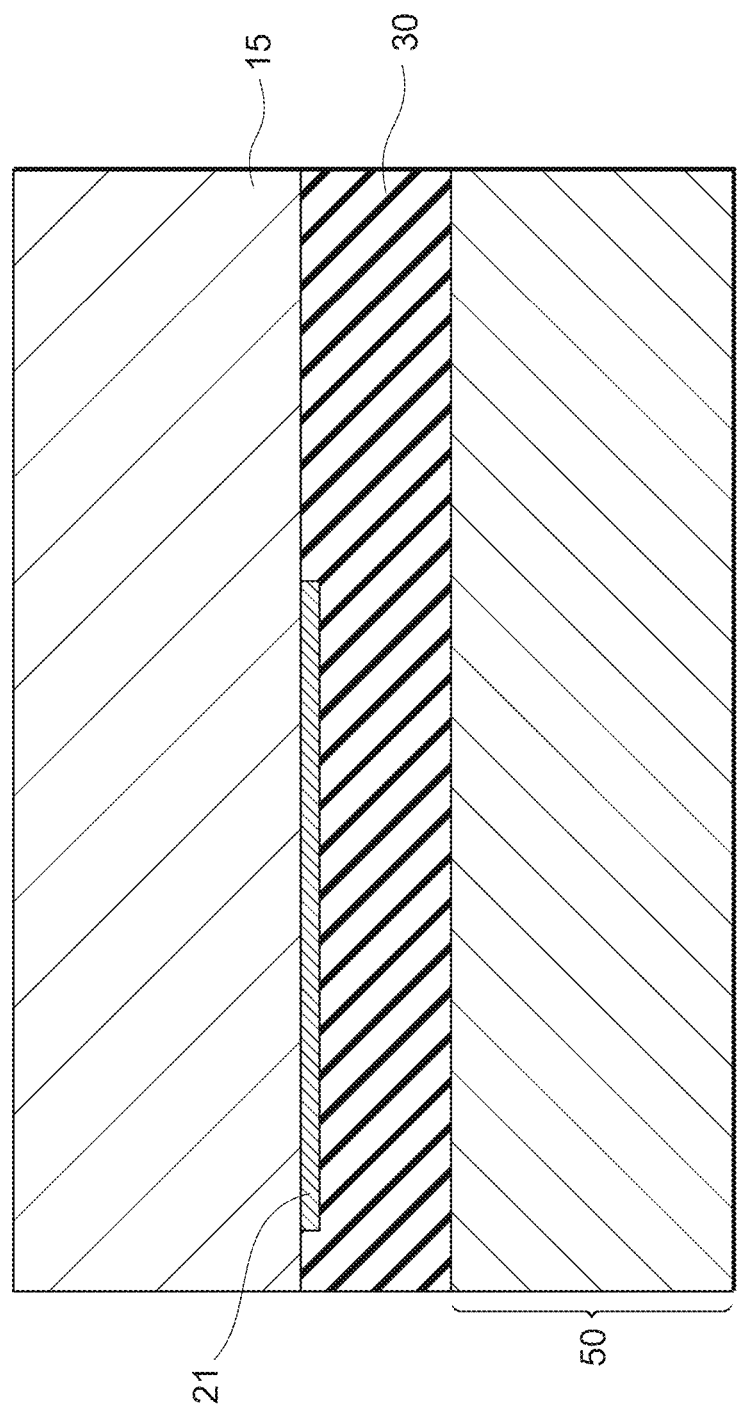
FIG. 13 is a schematic cross-sectional view illustrating the method of manufacturing the piezoelectric device according to the second preferred embodiment of the present invention.
Figure 14:
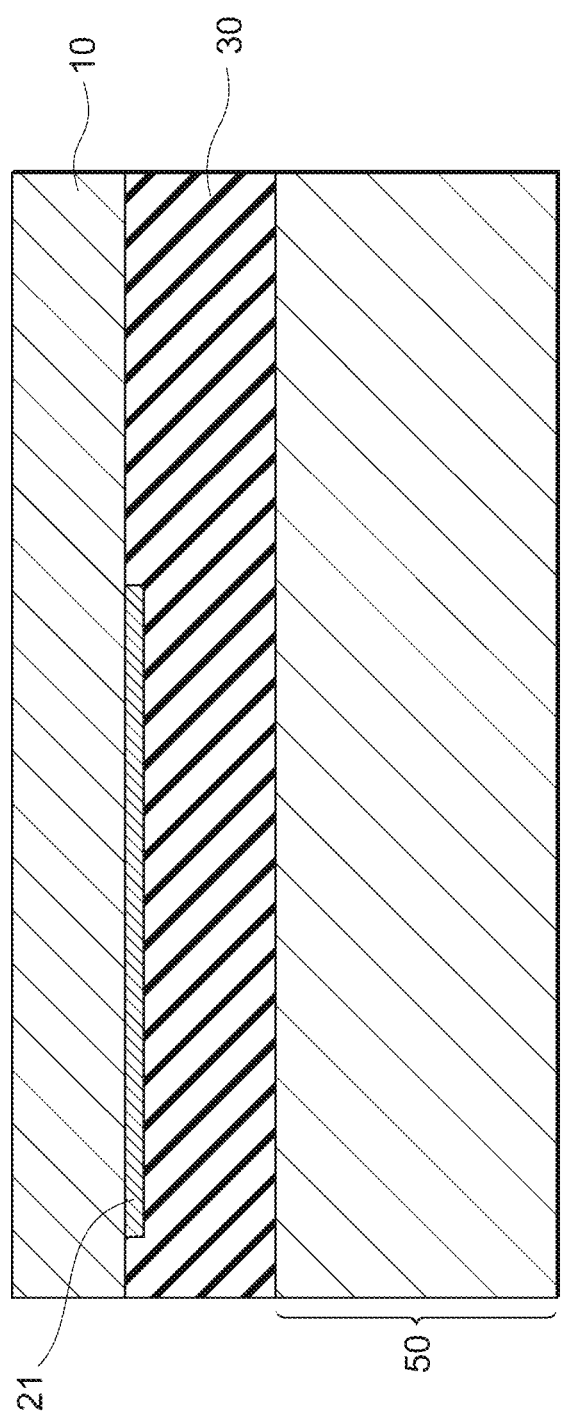
FIG. 14 is a schematic cross-sectional view illustrating the method of manufacturing the piezoelectric device according to the second preferred embodiment of the present invention.

As in the first preferred embodiment, as illustrated in FIG. 12, the lower electrode 21 is formed on the lower surface of the substrate piezoelectric body 15 by heteroepitaxial growth, and further the amorphous layer 30 is formed on the lower surface of the piezoelectric body 15 and the lower surface of the lower electrode 21. Further, a silicon substrate is prepared as the support substrate 50. Next, as illustrated in FIG. 13, an upper surface of the silicon substrate and the lower surface of the amorphous layer 30 are directly bonded to each other. Thereafter, as illustrated in FIG. 14, the substrate piezoelectric body 15 is polished from the upper surface side to be thinned to form a film.

Figure 15:
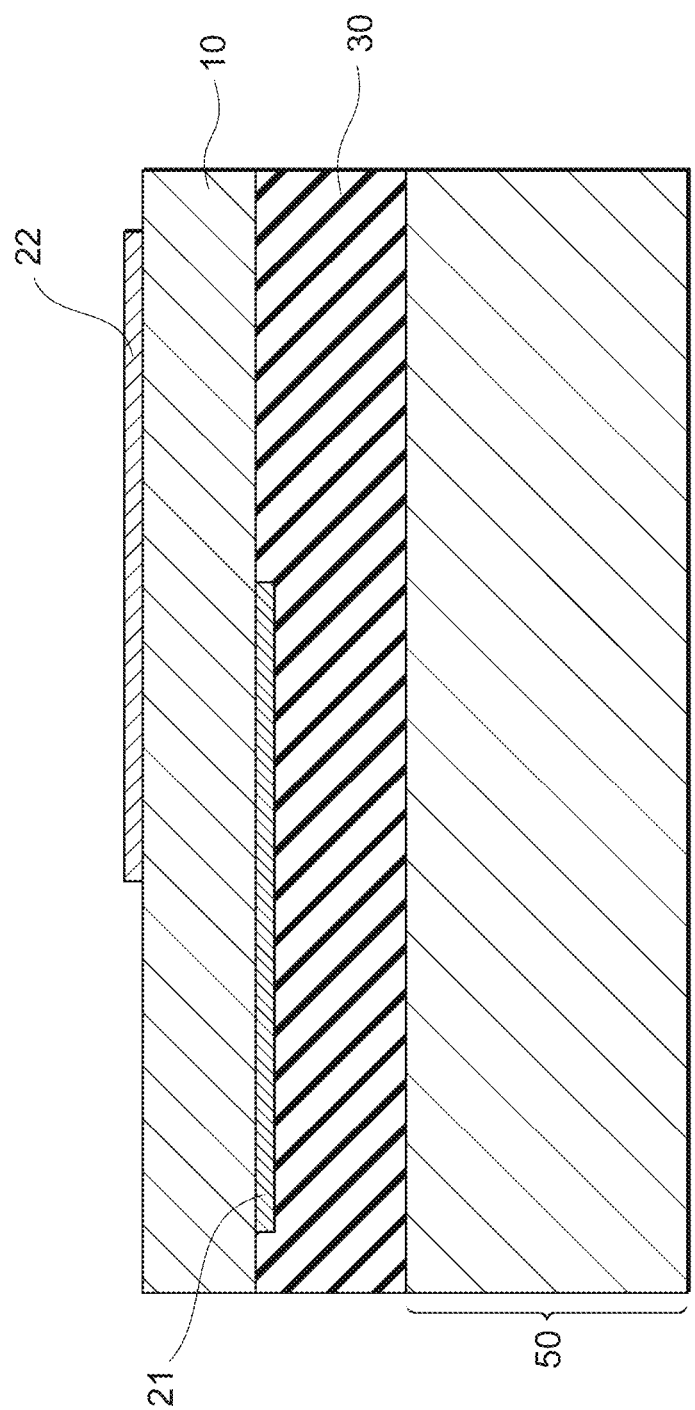
FIG. 15 is a schematic cross-sectional view illustrating the method of manufacturing the piezoelectric device according to the second preferred embodiment of the present invention.

As illustrated in FIG. 15, the upper electrode 22 is formed on the upper surface of the piezoelectric body 10 by the heteroepitaxial growth. Next, the recess 151 using the lower surface of the amorphous layer 30 as the bottom surface 152 illustrated in FIG. 11 is formed from a portion of the lower surface of the silicon substrate toward the piezoelectric body 10 by Deep RIE or the like. For example, the piezoelectric device according to the second preferred embodiment can be obtained by the manufacturing method including the above steps. Note that when forming the amorphous layer 30, the thickness of the amorphous layer 30 may be set to a thickness such that the flexural vibration membrane to be formed thereafter can bend and vibrate, or when forming the recess 151, the thickness of the amorphous layer 30 may be set to a thickness such that the flexural vibration membrane can bend and vibrate.

Third Preferred Embodiment

Figure 16:
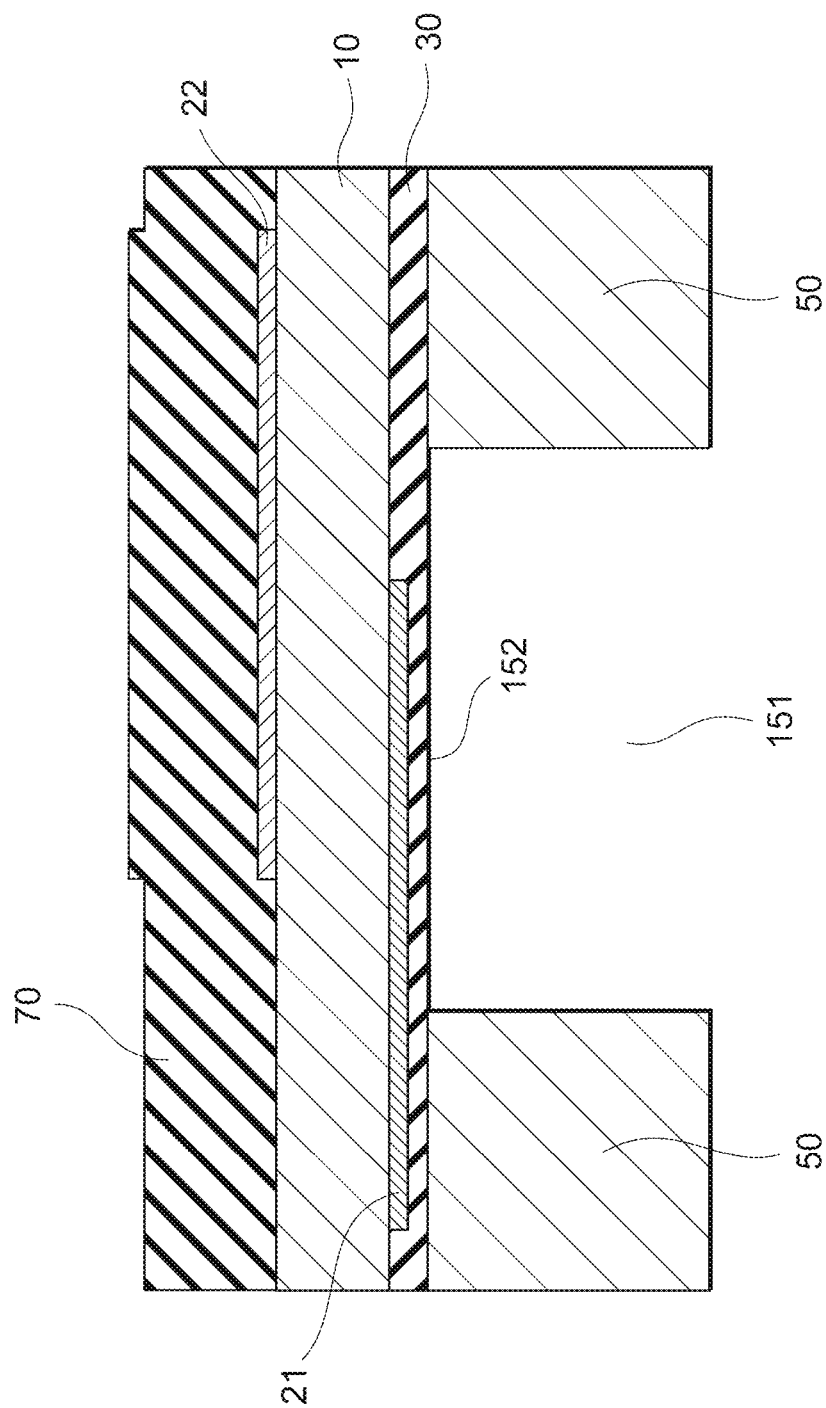
FIG. 16 is a schematic cross-sectional view illustrating a piezoelectric device according to a third preferred embodiment of the present invention.

As illustrated in FIG. 16, a piezoelectric device according to a third preferred embodiment of the present invention further includes a support film 70 covering the upper surface of the piezoelectric body 10 and the upper electrode 22. As a material of the support film 70, polysilicon, silicon nitride, aluminum nitride, and the like, for example, may preferably be used. In the third preferred embodiment, the support film 70 also defines a portion of the flexural vibration membrane. In this manner, the support film 70 covers the upper surface of the piezoelectric body 10, such that the support film 70 defines and functions as a protective film for the outside air.

In the third preferred embodiment, when a voltage is applied to the piezoelectric body 10 from the lower electrode 21 and the upper electrode 22, the piezoelectric body 10 tends to expand and contract in the in-plane direction, but the support film 70, the upper electrode 22, the lower electrode 21, and the amorphous layer 30 do not expand and contract, so that the flexural vibration membrane bends and vibrates vertically. It is preferable that a thickness of the support film 70 is set such that the neutral plane is within the support film 70 and not within the piezoelectric body 10 when the flexural vibration membrane bends and vibrates.

Next, a non-limiting example of a method of manufacturing the piezoelectric device according to the third preferred embodiment will be described.

Figure 17:
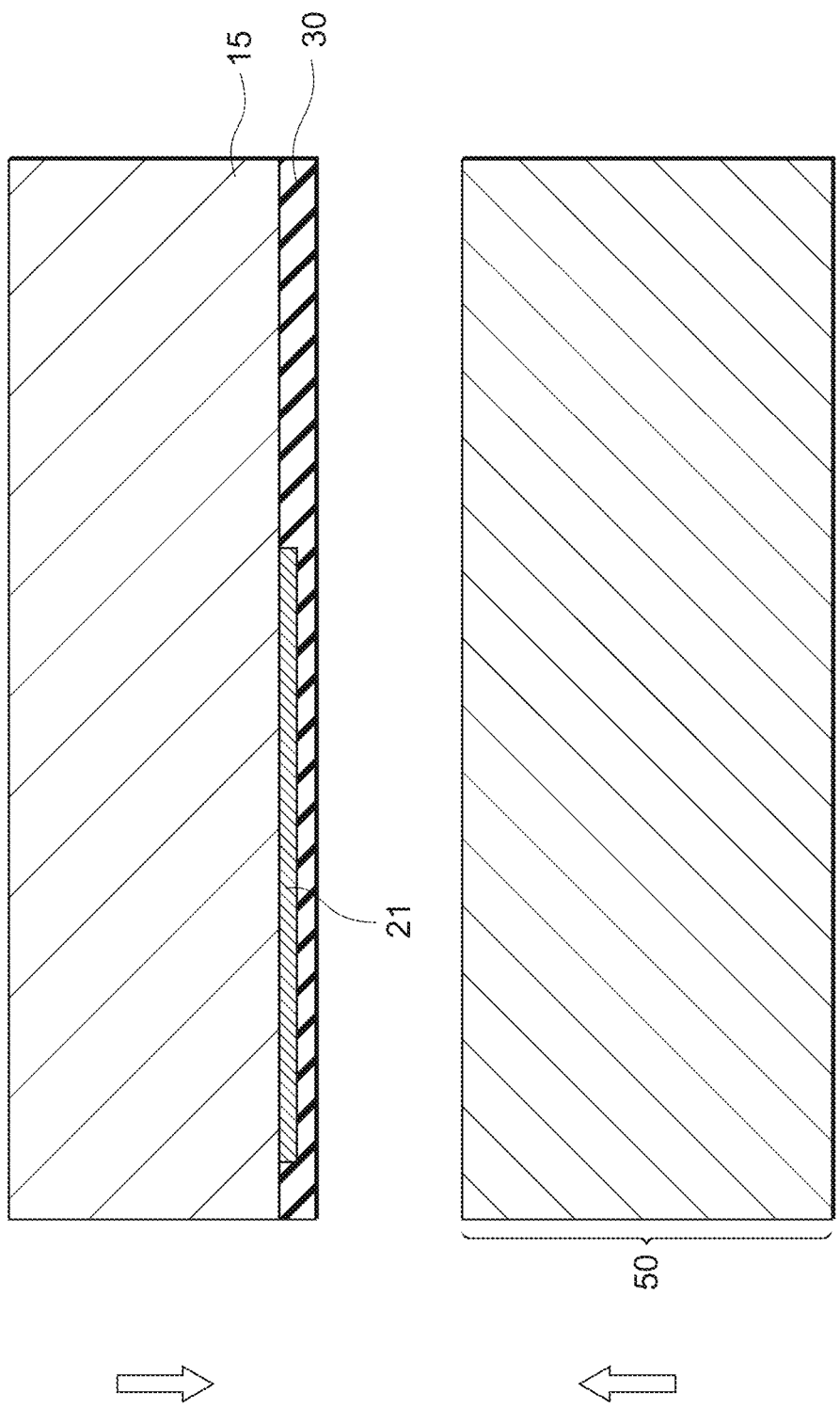
FIG. 17 is a schematic cross-sectional view illustrating a method of manufacturing the piezoelectric device according to the third preferred embodiment of the present invention.
Figure 18:
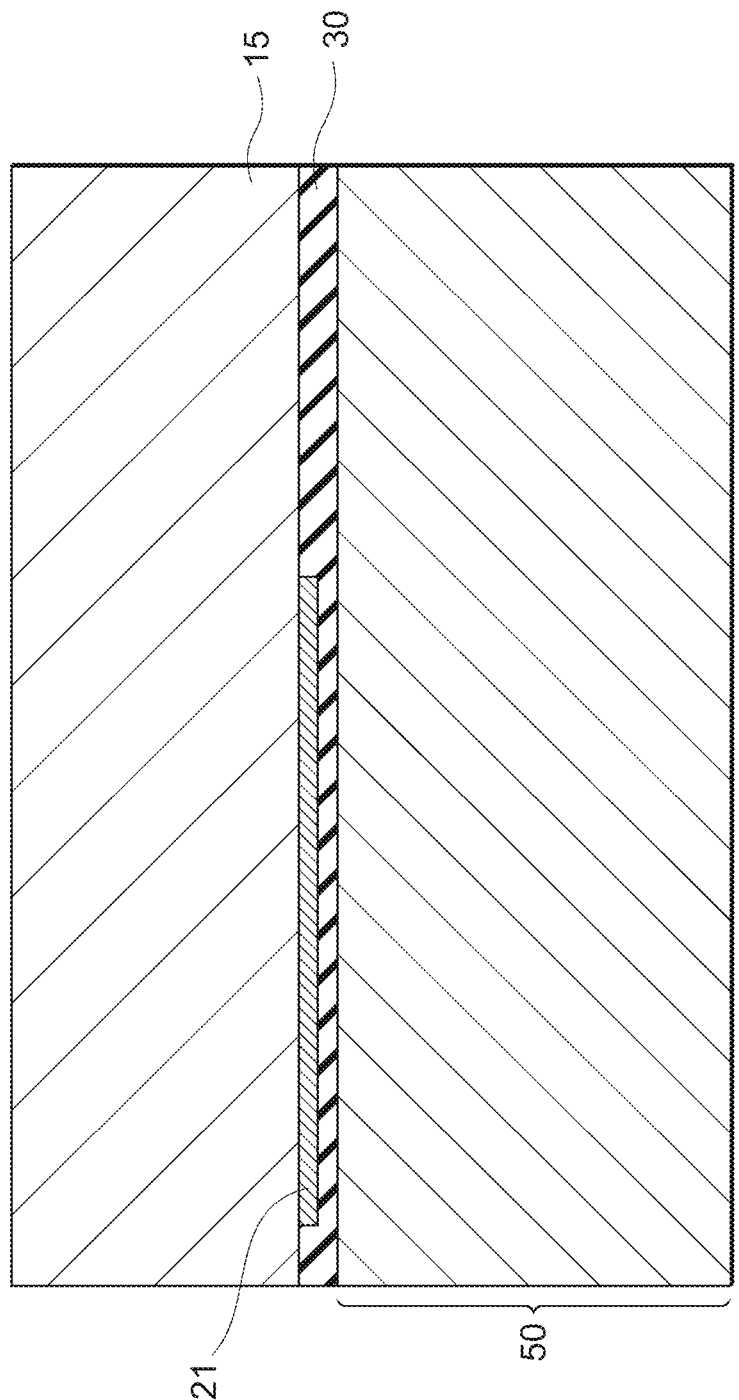
FIG. 18 is a schematic cross-sectional view illustrating the method of manufacturing the piezoelectric device according to the third preferred embodiment of the present invention.
Figure 19:
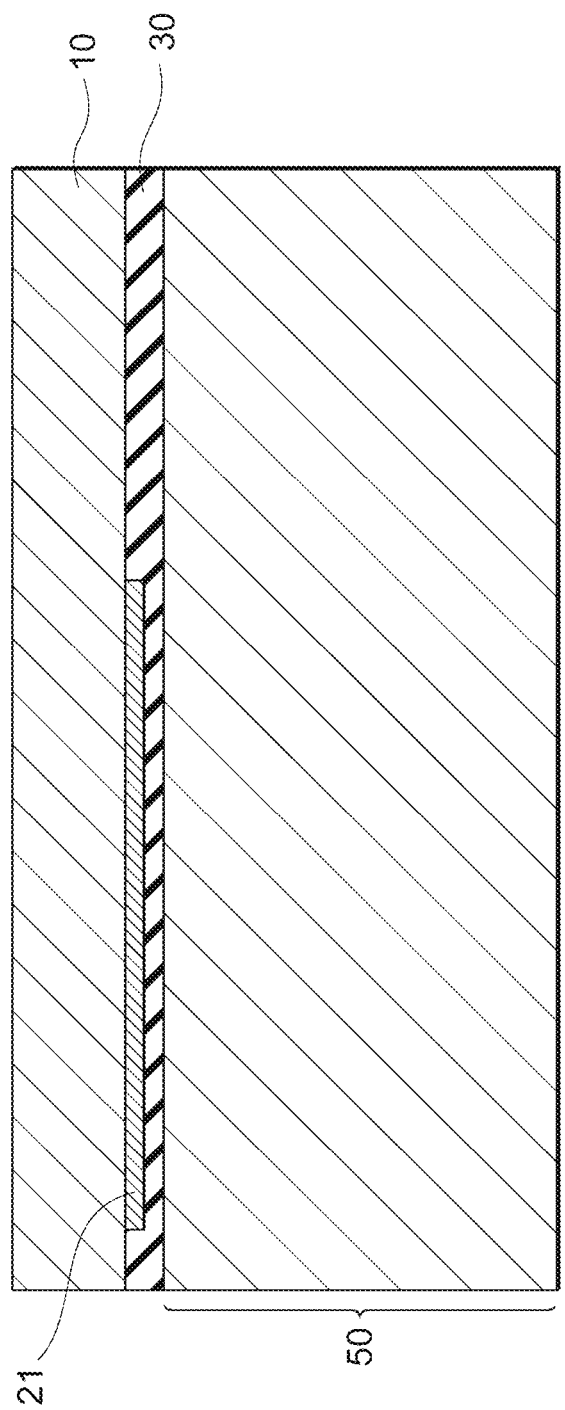
FIG. 19 is a schematic cross-sectional view illustrating the method of manufacturing the piezoelectric device according to the third preferred embodiment of the present invention.

As in the first preferred embodiment, as illustrated in FIG. 17, the lower electrode 21 is formed on the lower surface of the substrate piezoelectric body 15, and the amorphous layer 30 is formed on the lower surface of the piezoelectric body 15 and the lower surface of the lower electrode 21. Further, a silicon substrate is prepared as the support substrate 50. Next, as illustrated in FIG. 18, the upper surface of the silicon substrate and the lower surface of the amorphous layer 30 are directly bonded to each other. Thereafter, as illustrated in FIG. 19, the substrate piezoelectric body 15 is polished from the upper surface side to be thinned to form a film.

Figure 20:
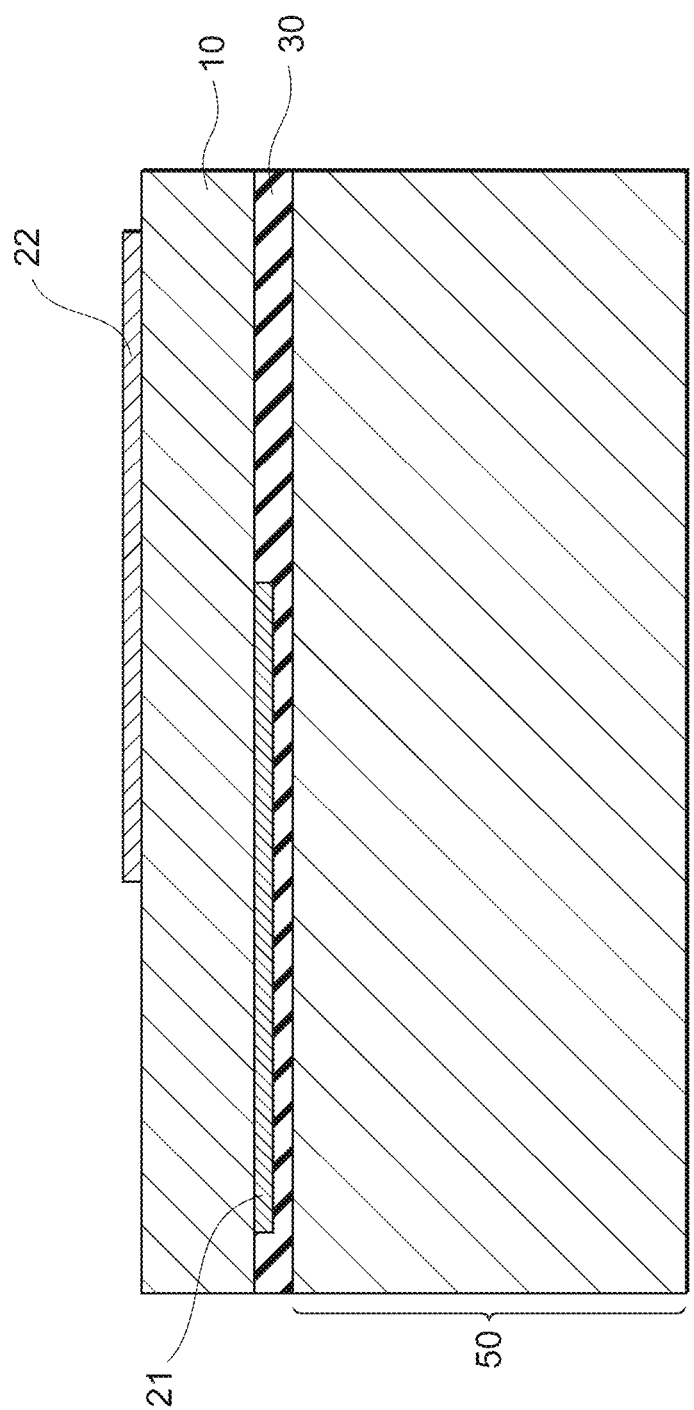
FIG. 20 is a schematic cross-sectional view illustrating the method of manufacturing the piezoelectric device according to the third preferred embodiment of the present invention.
Figure 21:
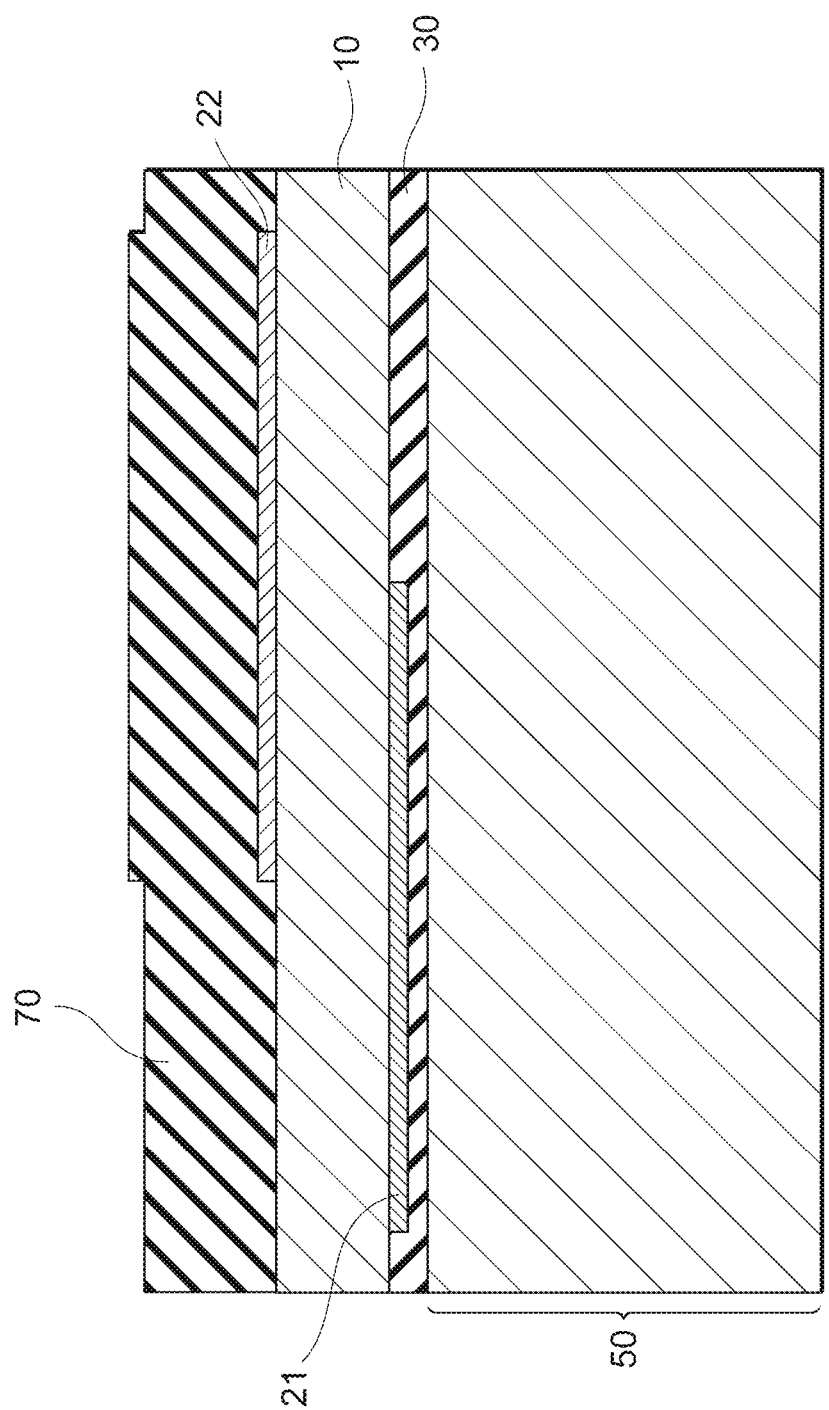
FIG. 21 is a schematic cross-sectional view illustrating the method of manufacturing the piezoelectric device according to the third preferred embodiment of the present invention.

As illustrated in FIG. 20, the upper electrode 22 is formed on the upper surface of the piezoelectric body 10. Next, as illustrated in FIG. 21, the support film 70 for covering the upper surface of the piezoelectric body 10 and the upper electrode 22 is formed. Optionally, portions of the amorphous layer 30, the piezoelectric body 10, and the support film 70 may be removed by an etching method or the like, thus being patterned into a desired shape. Next, the recess 151 using the lower surface of the amorphous layer 30 as the bottom surface 152 illustrated in FIG. 16 is formed from a portion of the lower surface of the silicon substrate toward the piezoelectric body 10 by Deep RIE or the like. Note that a portion of the amorphous layer 30 may also be removed to expose the lower electrode 21 and the lower surface of the piezoelectric body 10 to the bottom surface of the recess 151.

According to the method of manufacturing the piezoelectric device according to the third preferred embodiment, since the support film 70 is formed after the bonding between the support substrate 50 and the amorphous layer 30 and the polishing step of the piezoelectric body 10, the piezoelectric device may be manufactured more easily. In addition, it is possible to adjust the thickness of the support film 70 in accordance with a polishing state of the piezoelectric body 10.

Fourth Preferred Embodiment

Figure 22:
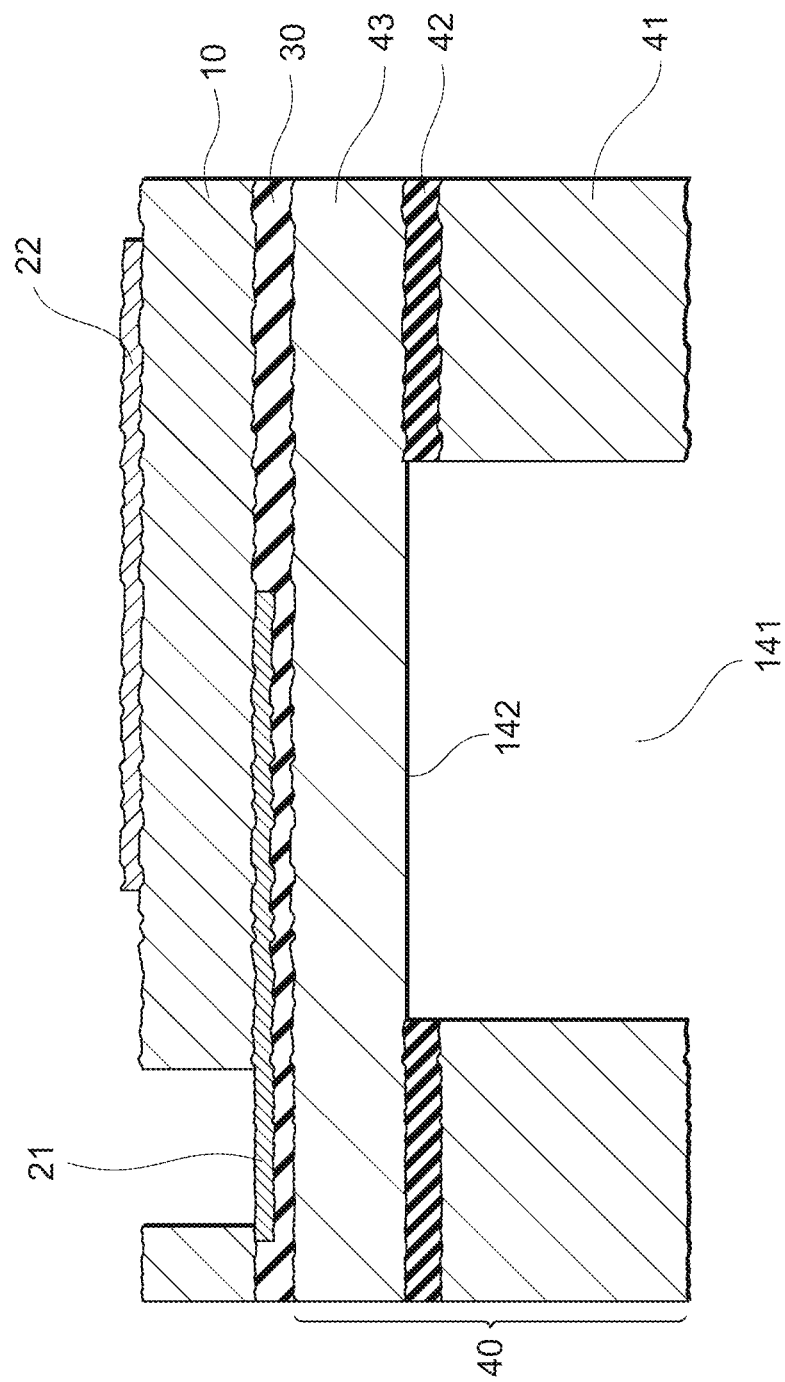
FIG. 22 is a schematic cross-sectional view illustrating a piezoelectric device according to a fourth preferred embodiment of the present invention.

As illustrated in FIG. 22, a piezoelectric device according to a fourth preferred embodiment of the present invention has the same or substantially the same configuration as that of the piezoelectric device according to the first preferred embodiment, but at least the handle layer 41, the active layer 43, and the piezoelectric body 10 each have a variation in a thickness direction. A surface of the handle layer 41 is provided with an unevenness, and flatness (TTV: Total Thickness Variation) of the surface of the handle layer 41 is preferably, for example, equal to or more than about 0 nm and equal to or less than about 2 μm, and more preferably equal to or more than about 0 nm and equal to or less than about 1 μm. A surface of the active layer 43 is provided with an unevenness along the unevenness of the surface of the handle layer 41. However, the variation in the thickness direction of the active layer 43 is smaller than the variation in the thickness direction of the handle layer 41. As such, a value of TTV of the surface of the active layer 43 becomes smaller than a value of TTV of the surface of the handle layer 41. A surface of the piezoelectric body 10 is provided with an unevenness along the unevenness of the surface of the handle layer 41 and the active layer 43. However, the variation in the thickness direction of the piezoelectric body 10 is smaller than the variation in the thickness direction of the active layer 43. As such, the value of TTV of the surface of the piezoelectric body 10 becomes smaller than the value of TTV of the surface of the active layer 43.

Next, a non-limiting example of a method of manufacturing the piezoelectric device according to the fourth preferred embodiment will be described.

Figure 23:
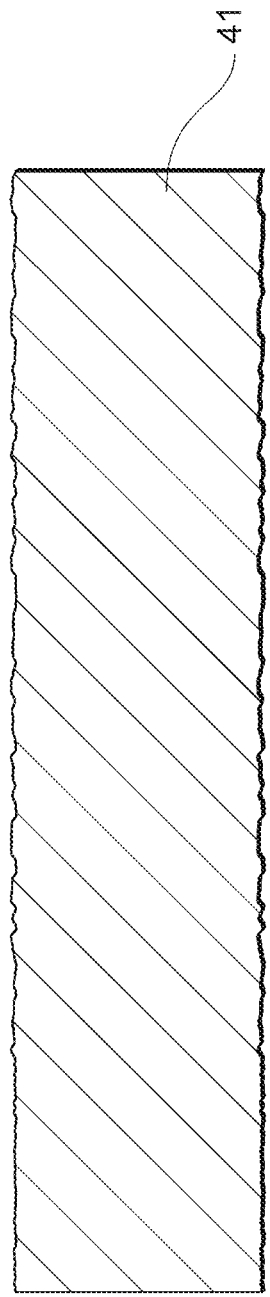
FIG. 23 is a schematic cross-sectional view illustrating a method of manufacturing the piezoelectric device according to the fourth preferred embodiment of the present invention.

As illustrated in FIG. 23, the handle layer 41 preferably made of, for example, silicon is prepared, and an upper surface and the lower surface of the handle layer 41 are polished or etched in a manner such that the TTV becomes a predetermined value, thus forming the unevenness on the upper surface and the lower surface of the handle layer 41. For example, when the handle layer 41 preferably has a diameter of about 4 inches, about 6 inches, or about 8 inches, the upper surface and the lower surface of the handle layer 41 are treated such that the TTV is preferably, for example, equal to or more than about 0 nm and equal to or less than about 2 μm, and more preferably equal to or more than about 0 nm and equal to or less than about 1 μm.

Figure 24:
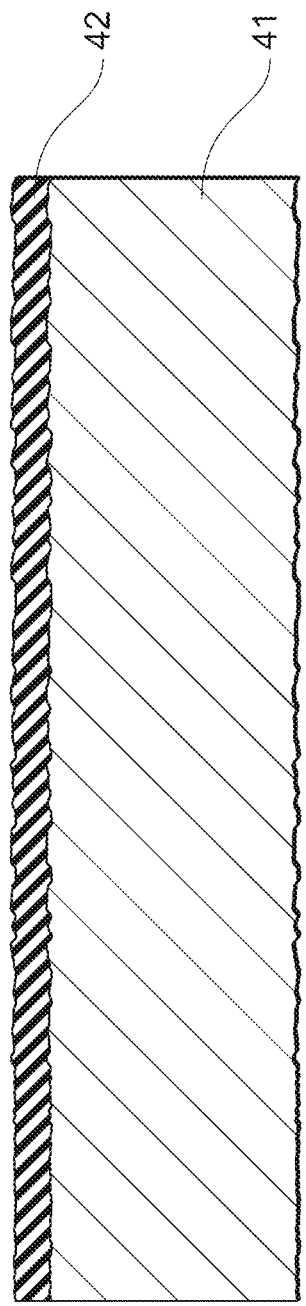
FIG. 24 is a schematic cross-sectional view illustrating the method of manufacturing the piezoelectric device according to the fourth preferred embodiment of the present invention.
Figure 25:
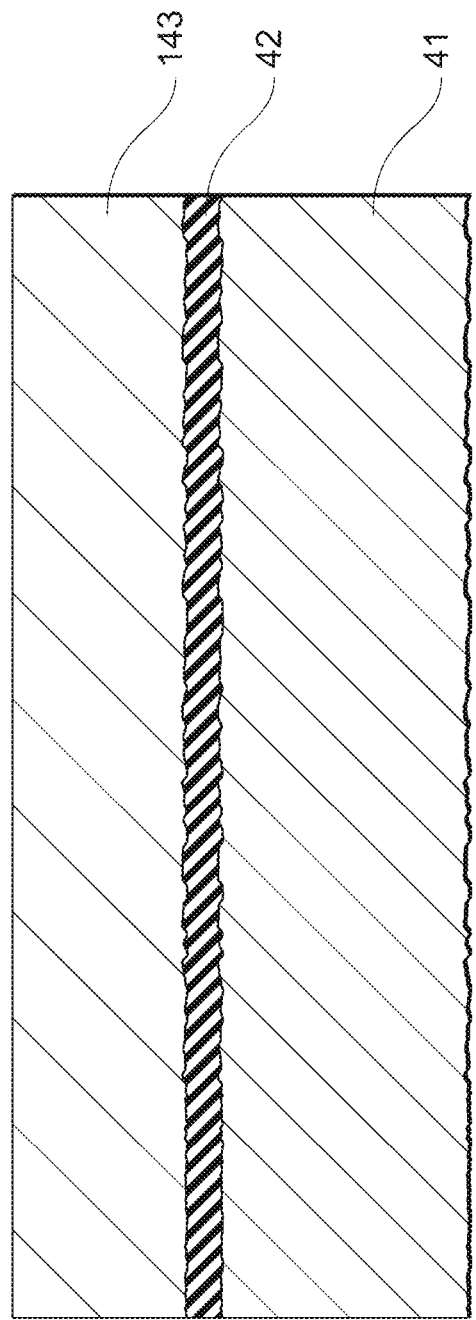
FIG. 25 is a schematic cross-sectional view illustrating the method of manufacturing the piezoelectric device according to the fourth preferred embodiment of the present invention.

The handle layer 41 is thermally oxidized, and the oxide film 42 is formed on the upper surface of the handle layer 41 as illustrated in FIG. 24. An uneven shape is also formed on the surface of the oxide film 42 according to an uneven shape of the surface of the handle layer 41. Thereafter, as illustrated in FIG. 25, the handle layer 41 on which the oxide film 42 is provided and the silicon substrate 143 are bonded each other by fusion bonding or the like.

Figure 26:
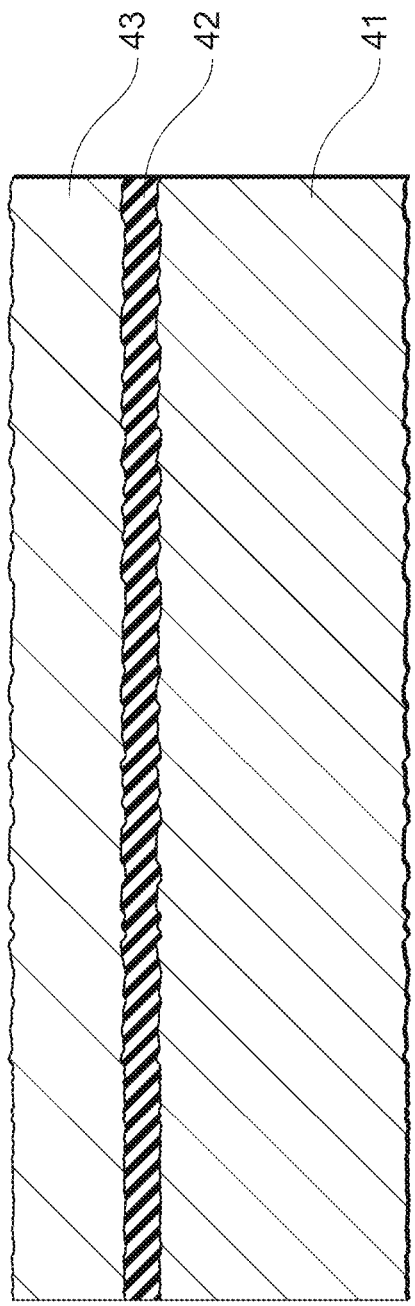
FIG. 26 is a schematic cross-sectional view illustrating the method of manufacturing the piezoelectric device according to the fourth preferred embodiment of the present invention.

The silicon substrate 143 is made to be a thin film by grinder machining or chemical-mechanical polishing (CMP), and the active layer 43 is formed on the oxide film 42 as illustrated in FIG. 26. With this, the support substrate 40 is formed, which is preferably, for example, a silicon on insulator (SOI) substrate including the handle layer 41, the embedded oxide film 42 disposed on the handle layer 41, and the active layer 43 disposed on the embedded oxide film 42. When the silicon substrate 143 is made to be a thin film, the lower surface of the handle layer 41 is used as a reference surface, so that an uneven shape is also formed on the upper surface of the active layer 43. However, the value of TTV in the active layer 43 becomes smaller than the value of TTV in the handle layer 41.

Figure 27:
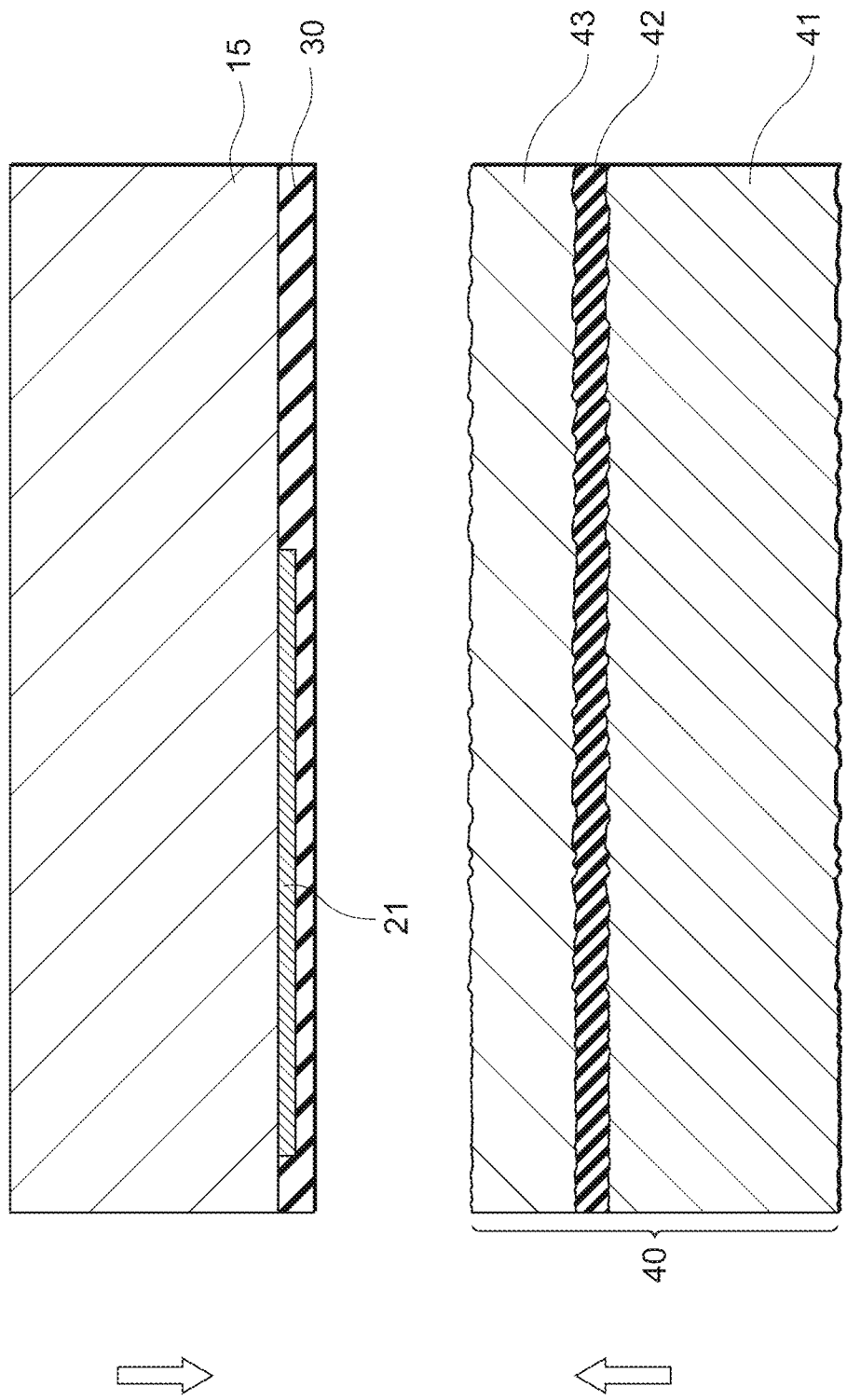
FIG. 27 is a schematic cross-sectional view illustrating the method of manufacturing the piezoelectric device according to the fourth preferred embodiment of the present invention.

As in the first preferred embodiment, as illustrated in FIG. 27, the lower electrode 21 is formed on the lower surface of the substrate piezoelectric body 15 by the heteroepitaxial growth, and the amorphous layer 30 is formed on the lower surface of the piezoelectric body 15 and the lower surface of the lower electrode 21.

Figure 28:
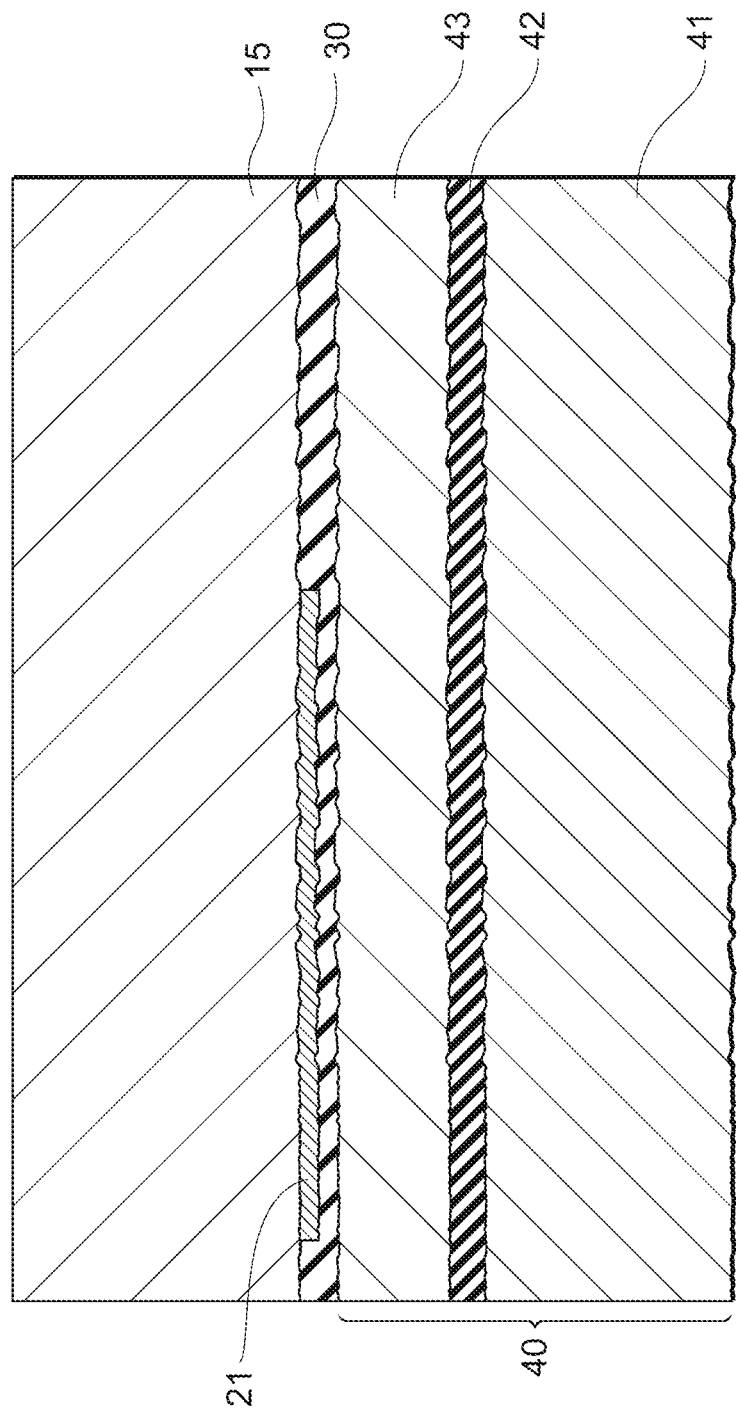
FIG. 28 is a schematic cross-sectional view illustrating the method of manufacturing the piezoelectric device according to the fourth preferred embodiment of the present invention.

As illustrated in FIG. 28, the upper surface of the active layer 43 of the SOI substrate and the lower surface of the amorphous layer 30 are directly bonded to each other. Before bonding, a layer made of the same material as that of the amorphous layer 30 or a layer made of a metal may be formed on the upper surface of the active layer 43.

Figure 29:
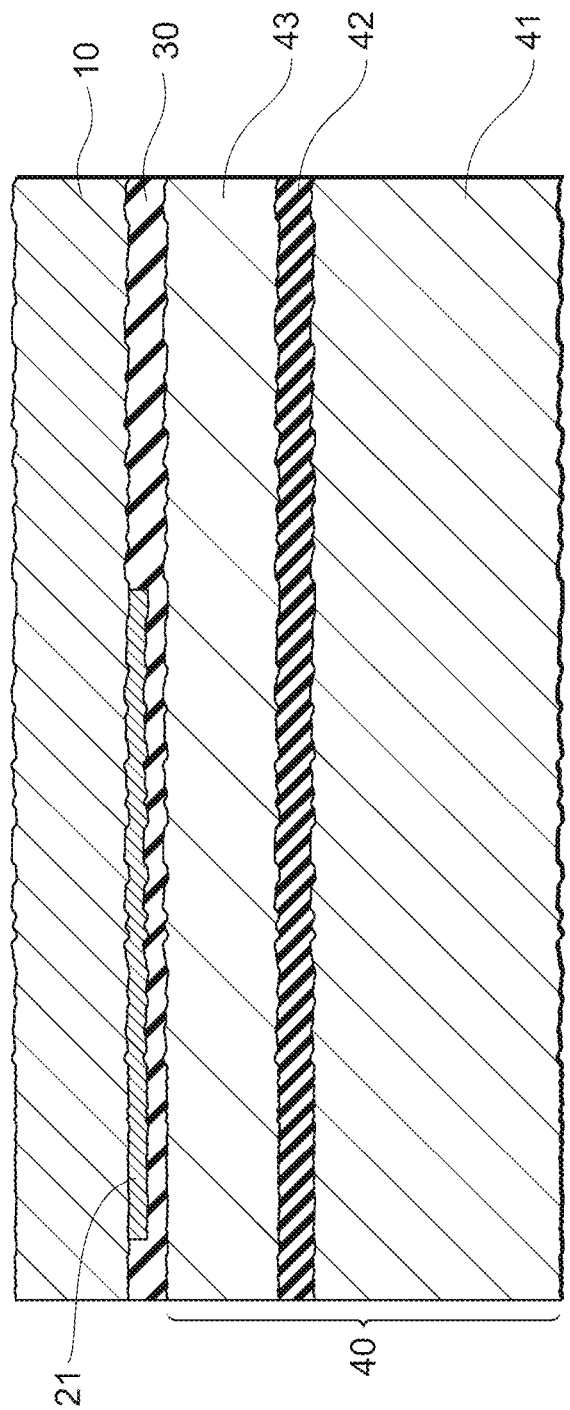
FIG. 29 is a schematic cross-sectional view illustrating the method of manufacturing the piezoelectric device according to the fourth preferred embodiment of the present invention.

As illustrated in FIG. 29, the substrate piezoelectric body 15 is polished from the upper surface side to be thinned, thus forming the piezoelectric body 10 as a film. At this time, by using the lower surface of the handle layer 41 as a reference surface, an uneven shape is also formed on the upper surface of the piezoelectric body 10. However, the value of TTV in the piezoelectric body 10 becomes smaller than the value of TTV in the handle layer 41. Alternatively, the upper surface of the piezoelectric body 10 may be flattened.

Figure 30:
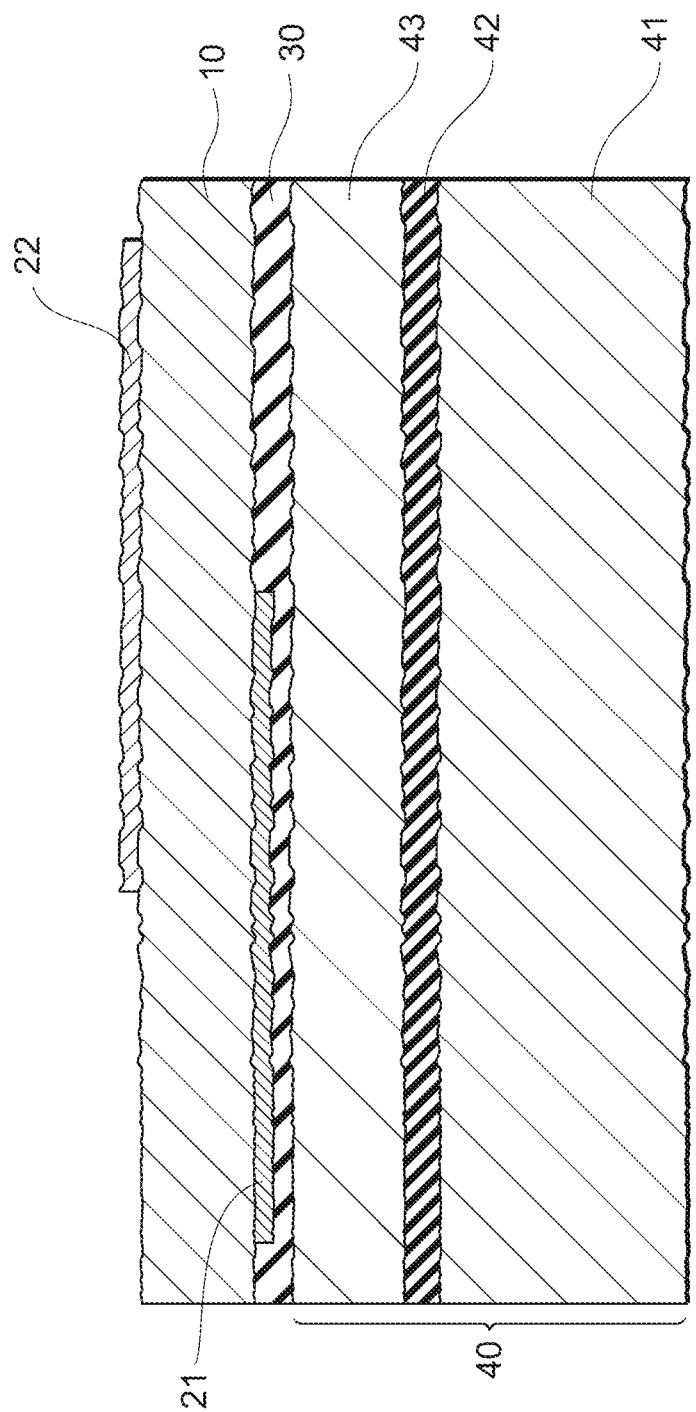
FIG. 30 is a schematic cross-sectional view illustrating the method of manufacturing the piezoelectric device according to the fourth preferred embodiment of the present invention.

As in the first preferred embodiment, as illustrated in FIG. 30, the upper electrode 22 is formed on the upper surface of the piezoelectric body 10. Thereafter, the recess 141 illustrated in FIG. 22 is formed from a portion of the lower surface of the handle layer 41 of the SOI substrate toward the lower surface of the piezoelectric body 10 by deep reactive ion etching (Deep RIE) or the like, as in the first preferred embodiment. The bottom surface 142 of the recess 141 formed by etching becomes flat.

According to the method of manufacturing the piezoelectric device according to the fourth preferred embodiment, it is possible to easily manufacture the piezoelectric device in which the TTV of the active layer 43 and the piezoelectric body 10 is smaller than the TTV of the handle layer 41. Since the TTV of the active layer 43 and the piezoelectric body 10 is small, a TTV of the flexural vibration membrane to be formed is reduced, and characteristics of the piezoelectric device are improved.

Fifth Preferred Embodiment

Figure 31:
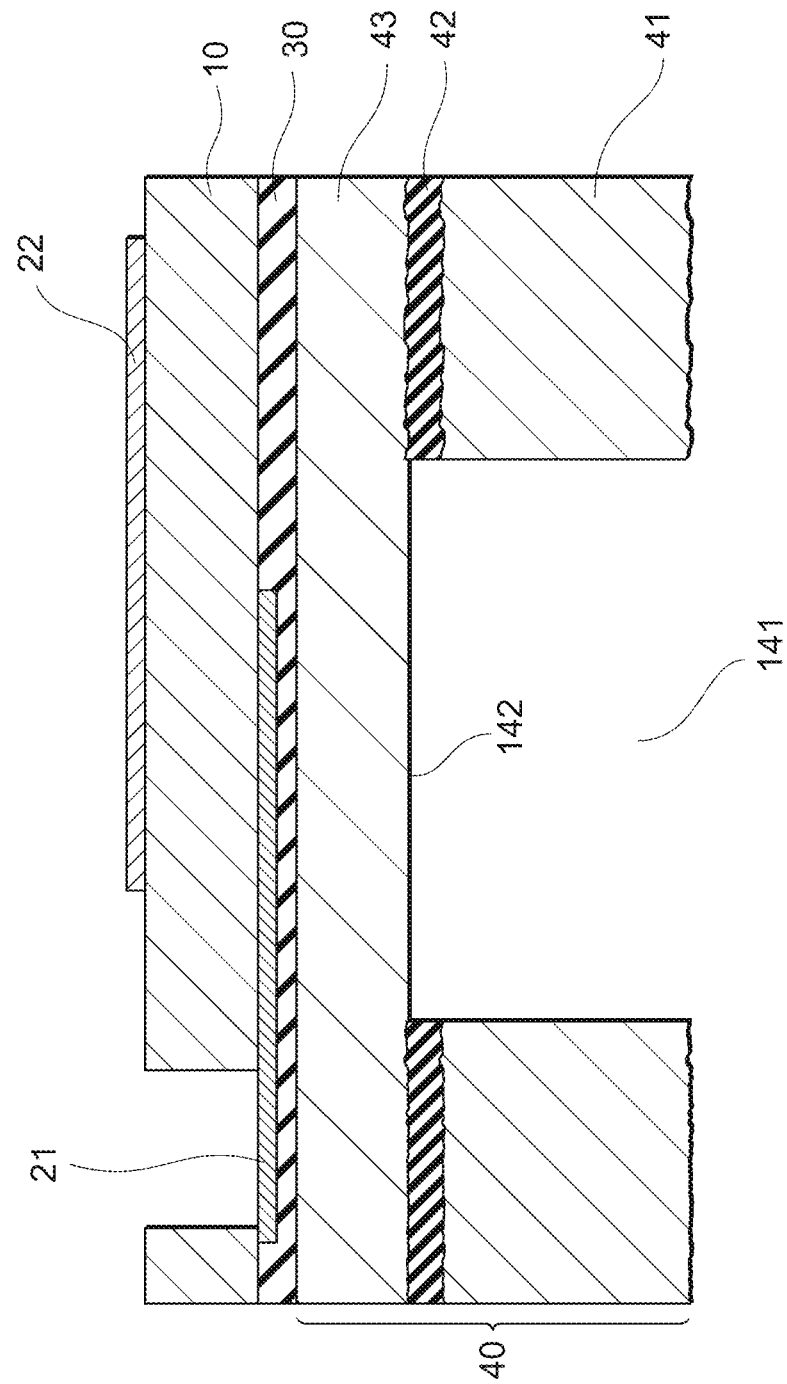
FIG. 31 is a schematic cross-sectional view illustrating a piezoelectric device according to a fifth preferred embodiment of the present invention.

In a piezoelectric device according to a fifth preferred embodiment of the present invention illustrated in FIG. 31, although the handle layer 41 has the variation in the thickness direction as in the fourth preferred embodiment, the upper surface of the active layer 43 is flat, and the upper surface and the lower surface of the piezoelectric body 10 are also flat. When manufacturing the piezoelectric device according to the fifth preferred embodiment, the handle layer 41 provided with the oxide film 42 and the silicon substrate 143 are bonded by fusion bonding or the like as in the fourth preferred embodiment, and then the upper surface of the active layer 43 may be flattened when making the silicon substrate 14 be a thin film to form the active layer 43.

As described above, the piezoelectric devices and the methods of manufacturing the piezoelectric devices according to each preferred embodiment of the present invention have the following configuration and advantageous operational effects as an example in accordance with the combination of any one or more of the above.

The piezoelectric devices according to preferred embodiments of the present invention each include the piezoelectric body 10 at least a portion of which can bend and vibrate, the upper electrode 22 which is disposed on the upper surface of the piezoelectric body 10 and in which distortion of the crystal lattice is reduced as a distance from the upper surface of the piezoelectric body 10 increases, the lower electrode 21 which is disposed on the lower surface of the piezoelectric body 10 and in which distortion of the crystal lattice is reduced as a distance from the lower surface of the piezoelectric body 10 increases, and the support substrate 40 disposed below the piezoelectric body 10. The piezoelectric device is provided with the recess 141 extending from the lower surface of the support substrate 40 toward the lower surface of the piezoelectric body 10.

In the piezoelectric device having a MEMS structure, a thickness of each of the upper electrode 22 and the lower electrode 21 is not negligible in the flexural vibration membrane. As such, the flexural vibration membrane is easily affected by a stress distribution in the upper electrode 22 and the lower electrode 21. However, in the piezoelectric devices according to preferred embodiments of the present invention, the degree of distortion in the crystal lattice of the lower electrode 21 and the upper electrode 22 changes symmetrically with the piezoelectric body 10 interposed therebetween. Therefore, in the piezoelectric devices according to preferred embodiments of the present invention, the stress distribution is symmetrical in a portion which can bend and vibrate, warpage is hardly generated, vibration efficiency is good, and cracks and interfacial peeling are hardly generated.

In the piezoelectric devices described above, a plurality of layers of the piezoelectric body 10 may be included, the plurality of layers may include an upper layer and a lower layer, the upper electrode 22 may be disposed on the upper surface of the piezoelectric body of the upper layer, and the lower electrode 21 may be disposed on the lower surface of the piezoelectric body of the lower layer.

According to this, it is possible to obtain a large displacement in flexural vibration by using a bimorph structure.

In the piezoelectric devices described above, the upper electrode 22 and the lower electrode 21 may have at least one or more kinds of triaxial textures. In the piezoelectric device described above, the upper electrode 22 and the lower electrode 21 may have one kind of triaxial texture.

According to this, performance of the piezoelectric device is improved. When the upper electrode 22 and the lower electrode 21 have one kind of triaxial texture, power durability is improved.

In the piezoelectric devices described above, the piezoelectric body 10 may be made of a single crystal. The piezoelectric body 10 may be made of lithium tantalate or lithium niobate.

According to this, since the piezoelectric body 10 is a single crystal, a polarization state is uniform, and since there is no grain boundary in the piezoelectric body 10, a stress distribution is hardly generated in the piezoelectric body 10, so that cracks and leaks are hardly generated.

In addition, according to preferred embodiments of the present invention, the methods of manufacturing the piezoelectric devices in which at least a portion of the piezoelectric body can bend and vibrate includes depositing a conductive material on the lower surface of the piezoelectric body 15 to form the lower electrode 21 made of a deposited conductive material, depositing a conductive material on the upper surface of the piezoelectric body 10 to form the upper electrode 22 made of a deposited conductive material, disposing the support substrate 40 below the piezoelectric body 10, and providing the recess 141 extending from the lower surface of the support substrate 40 toward the lower surface of the piezoelectric body 10.

In the piezoelectric devices manufactured by the manufacturing methods according to preferred embodiments of the present invention, the crystallinity of the lower electrode 21 and the upper electrode 22 varies symmetrically with the piezoelectric body 10 interposed therebetween. Therefore, in the piezoelectric devices manufactured by the manufacturing methods according to preferred embodiments of the present invention, the stress distribution is symmetrical in a portion which can bend and vibrate, warpage is hardly generated, vibration efficiency is good, and cracks and interfacial peeling are hardly generated.

In the methods of manufacturing the piezoelectric devices described above, the piezoelectric body 10 may include a plurality of layers, and the plurality of layers may include the upper layer and the lower layer, the lower electrode 21 may be formed on the lower surface of the piezoelectric body of the lower layer, and the upper electrode 22 may be formed on the upper surface of the piezoelectric body of the upper layer.

According to this, since the piezoelectric device having the bimorph structure is manufactured, it is possible to obtain a large displacement in the flexural vibration of the piezoelectric device to be manufactured.

In the methods of manufacturing the piezoelectric devices described above, the upper electrode 22 and the lower electrode 21 may be formed by epitaxially growing a conductive material.

According to this, the distortion of the crystal lattice of the upper electrode 22 and the lower electrode 21 is made to be symmetrical but be good, and the performance of the piezoelectric device is improved.

In the methods of manufacturing the piezoelectric devices described above, the lower electrode 21 may be formed on the lower surface of the piezoelectric body 15 with a lower adhesion layer made of a metal interposed therebetween.

According to this, adhesiveness between the piezoelectric body 10 and the lower electrode 21 is improved in the piezoelectric device to be manufactured, and reliability of the piezoelectric device is improved.

In the methods of manufacturing the piezoelectric devices described above, the upper electrode 22 may be formed on the upper surface of the piezoelectric body 10 with an upper adhesion layer made of a metal interposed therebetween.

According to this, adhesiveness between the piezoelectric body 10 and the upper electrode 22 is improved in the piezoelectric device to be manufactured, and the reliability of the piezoelectric device is improved.

In the methods of manufacturing the piezoelectric devices described above, the piezoelectric body 15 may be made of a single crystal. Alternatively, the piezoelectric body 15 may be made of lithium tantalate or lithium niobate.

According to this, since the piezoelectric body 10 is a single crystal in the piezoelectric device to be manufactured, there is no need to perform polarization treatment of the piezoelectric body 15 after forming the upper electrode 22 and the lower electrode 21, and since there is no grain boundary in the piezoelectric body 10, stress is hardly generated in the piezoelectric body 10, so that cracks and leaks are hardly generated.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A piezoelectric device comprising:
a piezoelectric body at least a portion of which is capable of bending and vibrating;
an upper electrode which is disposed on an upper surface of the piezoelectric body and in which distortion of a crystal lattice is reduced as a distance from the upper surface increases;
a lower electrode which is disposed on a lower surface of the piezoelectric body and in which distortion of a crystal lattice is reduced as a distance from the lower surface increases; and
a support substrate disposed below the piezoelectric body; wherein
a recess extending from a lower surface of the support substrate toward the lower surface of the piezoelectric body is provided.

2. The piezoelectric device according to claim 1, wherein a plurality of layers of the piezoelectric body are included; the plurality of layers include an upper layer and a lower layer;
the upper electrode is disposed on an upper surface of the upper layer; and
the lower electrode is disposed on a lower surface of the lower layer.

3. The piezoelectric device according to claim 1, wherein the upper electrode and the lower electrode include at least one or more kinds of triaxial textures.

4. The piezoelectric device according to claim 1, wherein the upper electrode and the lower electrode include one kind of triaxial texture.

5. The piezoelectric device according to claim 1, further comprising a lower adhesion layer made of a metal between the piezoelectric body and the lower electrode.

6. The piezoelectric device according to claim 1, further comprising an upper adhesion layer made of a metal between the piezoelectric body and the upper electrode.

7. The piezoelectric device according to claim 1, wherein the piezoelectric body is made of a single crystal.

8. The piezoelectric device according to claim 1, wherein the piezoelectric body is made of lithium tantalate or lithium niobate.

9. The piezoelectric device according to claim 1, further comprising an amorphous layer disposed on the lower surface of the piezoelectric body and on a lower surface of the lower electrode.

10. The piezoelectric device according to claim 9, wherein the amorphous layer is made of silicon oxide.

11. The piezoelectric device according to claim 1, wherein the upper surface and the lower surface of the piezoelectric body are flat and smooth such that a Total Thickness Variation is equal to or less than about 2 μm.

* * * * *